United States Patent
Cho et al.

(10) Patent No.: US 12,451,061 B2
(45) Date of Patent: *Oct. 21, 2025

(54) DISPLAY DEVICE

(71) Applicant: SAMSUNG DISPLAY CO., LTD., Yongin-si (KR)

(72) Inventors: Seung Hwan Cho, Yongin-si (KR); Jong Hyun Choi, Seoul (KR); Ju Chan Park, Seoul (KR); Seung Min Song, Gwangju (KR); Min Seong Yi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/407,361

(22) Filed: Jan. 8, 2024

(65) Prior Publication Data

US 2024/0144871 A1 May 2, 2024

Related U.S. Application Data

(63) Continuation of application No. 18/062,009, filed on Dec. 5, 2022, now Pat. No. 11,869,422, which is a continuation of application No. 16/850,282, filed on Apr. 16, 2020, now Pat. No. 11,521,545.

(30) Foreign Application Priority Data

Jul. 30, 2019 (KR) ........................ 10-2019-0092466

(51) Int. Cl.
*G09G 3/3225* (2016.01)
*H10K 59/88* (2023.01)

(52) U.S. Cl.
CPC ... *G09G 3/3225* (2013.01); *G09G 2300/0426* (2013.01)

(58) Field of Classification Search
None
See application file for complete search history.

(56) References Cited

U.S. PATENT DOCUMENTS

| | | | | |
|---|---|---|---|---|
| 6,954,184 B2* | 10/2005 | Kurashima | ......... | G02F 1/13452 345/1.3 |
| 7,301,509 B2* | 11/2007 | Yun | ...................... | G09G 3/3611 345/1.3 |
| 7,349,037 B2* | 3/2008 | Na | ...................... | G02F 1/13452 349/40 |
| 9,293,649 B2* | 3/2016 | Park | .................... | G02F 1/13624 |

(Continued)

FOREIGN PATENT DOCUMENTS

| | | |
|---|---|---|
| KR | 10-2018-0125061 A | 11/2018 |
| KR | 10-2019-0083392 A | 7/2019 |
| WO | 2018/062023 A1 | 4/2018 |

*Primary Examiner* — Sepehr Azari
(74) *Attorney, Agent, or Firm* — Womble Bond Dickinson (US) LLP

(57) ABSTRACT

A display device, includes: a display area and a non-display area; a plurality of signal lines over the display area; and a plurality of connection lines in the display area and connected to the signal lines, wherein the plurality of connection lines includes a plurality of first connection lines connected to the signal lines, respectively, a plurality of third connection lines on a same layer as the first connection lines, and a plurality of second connection lines connecting the first connection lines to the third connection lines.

11 Claims, 23 Drawing Sheets

(56) References Cited

U.S. PATENT DOCUMENTS

| | | | | |
|---|---|---|---|---|
| 9,495,903 B2* | 11/2016 | Kwon | | G09G 3/006 |
| 10,727,293 B2 | 7/2020 | Jeong et al. | | |
| 10,748,955 B2* | 8/2020 | Oh | | H01L 27/14685 |
| 11,244,997 B2 | 2/2022 | Jeong et al. | | |
| 11,580,914 B2* | 2/2023 | Cho | | G09G 3/3291 |
| 11,665,942 B2 | 5/2023 | Jeong et al. | | |
| 2003/0156079 A1* | 8/2003 | Nakanishi | | H10K 59/131 |
| | | | | 345/45 |
| 2006/0022911 A1* | 2/2006 | Satoh | | G09G 3/3216 |
| | | | | 345/76 |
| 2007/0120778 A1* | 5/2007 | Kimura | | G09G 3/3216 |
| | | | | 345/76 |
| 2010/0320472 A1* | 12/2010 | Liu | | H10D 86/441 |
| | | | | 257/59 |
| 2012/0313914 A1* | 12/2012 | Matsumoto | | H01J 11/12 |
| | | | | 345/60 |
| 2015/0348455 A1* | 12/2015 | Jeon | | G02F 1/134336 |
| | | | | 345/55 |
| 2016/0080731 A1* | 3/2016 | Niu | | G02F 1/136286 |
| | | | | 348/54 |
| 2017/0060317 A1* | 3/2017 | Kim | | H10D 86/423 |
| 2017/0185196 A1* | 6/2017 | Kim | | G09G 3/3677 |
| 2017/0270842 A1* | 9/2017 | Nam | | H01L 22/32 |
| 2017/0288003 A1* | 10/2017 | Kim | | H10K 59/123 |
| 2017/0337865 A1* | 11/2017 | Kim | | H10K 59/131 |
| 2018/0145125 A1* | 5/2018 | Lee | | H10K 59/131 |
| 2018/0188616 A1* | 7/2018 | Jeong | | G02F 1/134336 |
| 2018/0330672 A1* | 11/2018 | Park | | G09G 3/3233 |
| 2018/0331124 A1* | 11/2018 | Cho | | H10D 86/411 |
| 2018/0331171 A1* | 11/2018 | Kim | | H10K 59/126 |
| 2018/0342572 A1* | 11/2018 | Park | | H01L 27/1248 |
| 2019/0096345 A1* | 3/2019 | Han | | G09G 3/3648 |
| 2019/0131360 A1* | 5/2019 | Lee | | H10K 59/131 |
| 2019/0157375 A1* | 5/2019 | Liang | | H10K 59/131 |
| 2019/0206894 A1* | 7/2019 | Lee | | G02F 1/1345 |
| 2019/0206976 A1* | 7/2019 | Jeong | | G09G 3/3225 |
| 2019/0265824 A1* | 8/2019 | Abe | | G06F 3/0443 |
| 2019/0278145 A1* | 9/2019 | Tanaka | | G02F 1/136286 |
| 2019/0392771 A1* | 12/2019 | Xu | | G02F 1/167 |
| 2020/0013844 A1* | 1/2020 | Cho | | G06F 3/0446 |
| 2020/0064702 A1* | 2/2020 | Yeh | | H10K 59/122 |
| 2020/0117313 A1* | 4/2020 | Zhang | | G06F 3/0446 |
| 2020/0273928 A1* | 8/2020 | Che | | G09G 3/3258 |
| 2020/0381505 A1* | 12/2020 | Cho | | H10K 59/131 |
| 2021/0036022 A1* | 2/2021 | Han | | G09G 3/3607 |
| 2024/0321899 A1* | 9/2024 | Tang | | G09G 3/3674 |

* cited by examiner

DISPLAY DEVICE

CROSS-REFERENCE TO RELATED APPLICATIONS

This application is a continuation of U.S. patent application Ser. No. 18/062,009, filed Dec. 5, 2022, which is a continuation of U.S. patent application Ser. No. 16/850,282, filed Apr. 16, 2020, now U.S. Pat. No. 11,521,545, which claims priority to and the benefit of Korean Patent Application No. 10-2019-0092466, filed Jul. 30, 2019, the entire content of all of which is incorporated herein by reference.

BACKGROUND

1. Field

Aspects of some example embodiments of the present disclosure relate to a display device.

2. Description of the Related Art

The importance of a display device has been increasing with the development of multimedia. In this regard, various types of display devices, such as liquid crystal displays (LCD) and organic light emitting displays (OLED), are used. Among the above display devices, the organic light emitting display has a relatively wide viewing angle, and may include a self-emissive element.

The organic light emitting display includes a pixel circuit and a driving unit for driving the pixel circuit. The driving unit may include a scan driver that provides a scan signal to the pixel circuit, a data driver that provides a data signal to the pixel circuit, and the like. Driving circuits of the scan driver and the data driver may be arranged in a non-display area adjacent to a display area, and the non-display area may serve as a kind of dead space in terms of the functionality of the display device.

The above information disclosed in this Background section is only for enhancement of understanding of the background and therefore the information discussed in this Background section does not necessarily constitute prior art.

SUMMARY

Aspects of the present disclosure provide a display device which minimizes or reduces a non-display area of the display device, and prevents or reduces degradation of display quality.

Technical problems of the present disclosure are not limited to the above-mentioned technical problems, and a person having ordinary skill in the art may apparently understand other technical problems not mentioned herein on the basis of the following descriptions.

According to some example embodiments of the present disclosure, a display device includes: a display area and a non-display area, the display device comprises a plurality of signal lines over the display area, and a plurality of connection lines in the display area and connected to the signal lines, wherein the plurality of connection lines include a plurality of first connection lines connected to the signal lines, respectively, third connection lines on the same layer as the first connection lines, and second connection lines configured to connect the first connection lines to the third connection lines.

According to some example embodiments, wherein the first connection lines and the third connection lines extend in a first direction, and the second connection lines extend in a second direction intersecting the first direction.

According to some example embodiments, the display device further comprises a plurality of first dummy patterns and a plurality of second dummy patterns, wherein the first dummy patterns are on the same layer as the first connection lines, and the second dummy patterns are on the same layer as the second connection lines.

According to some example embodiments, wherein the first dummy patterns extend in a first direction, and the second dummy patterns extend in a second direction intersecting the first direction.

According to some example embodiments, wherein an interval between the plurality of first dummy patterns in the second direction is substantially equal to an interval between the plurality of first connection lines in the second direction.

According to some example embodiments, wherein the signal lines are formed of a first conductive layer, the first connection lines or the third connection lines are formed of a second conductive layer, the second connection lines are formed of a third conductive layer, and the second conductive layer is between the first conductive layer and the third conductive layer.

According to some example embodiments, wherein the second connection line is electrically connected to the first connection line through a first contact hole exposing one end of the first connection line.

According to some example embodiments, wherein the second connection line is electrically connected to the third connection line through a second contact hole exposing one end of the third connection line.

According to some example embodiments, wherein the first dummy patterns are formed of the second conductive layer, and the second dummy patterns are formed of the third conductive layer.

According to some example embodiments, the display device further comprises a power supply voltage line formed of the first conductive layer, wherein the power supply voltage line is electrically connected to the second dummy pattern.

According to some example embodiments of the present disclosure, a display device includes: a substrate including a display area and a non-display area, a plurality of signal lines in the display area of the substrate, a plurality of connection lines in the display area and connected to the signal lines, a first electrode on the connection line, a light emitting layer on the first electrode, and a second electrode on the light emitting layer, wherein the plurality of connection lines include first connection lines respectively connected to the signal lines and second connection lines respectively connected to the first connection lines, and the first connection line and the second connection line are on different layers from each other.

According to some example embodiments, wherein the signal lines are formed of a first conductive layer, the first connection lines are formed of a second conductive layer, the second connection lines are formed of a third conductive layer, and the second conductive layer is between the first conductive layer and the third conductive layer.

According to some example embodiments, the display device further comprises a semiconductor layer on the substrate, and a first gate conductive layer on the semiconductor layer, wherein the first gate conductive layer is between the semiconductor layer and the first conductive layer.

According to some example embodiments, wherein the first electrode is between the third conductive layer and the second electrode.

According to some example embodiments, wherein the first connection lines extend in a first direction, and the second connection lines extend in a second direction intersecting the first direction.

According to some example embodiments, wherein the connection line further includes a plurality of third connection lines connected to the second connection lines, and the third connection lines extend in the first direction and are on the same layer as the first connection line.

According to some example embodiments, the display device further comprises a plurality of first dummy patterns and a plurality of second dummy patterns in the display area, wherein the first dummy patterns are on the same layer as the signal lines, and the second dummy patterns are on the same layer as the first connection lines.

According to some example embodiments, wherein the display area includes a front display area, a first side display area extending from a first side of the front display area, and a second side display area extending from a second side of the front display area.

According to some example embodiments, wherein the plurality of connection lines extend from the non-display area and extend to the non-display area via the first side display area, the front display area, and the second side display area.

According to some example embodiments, the display device further comprises a corner area between the first side display area and the second side display area, wherein the first connection line is connected to the signal line through a contact hole in the corner area.

BRIEF DESCRIPTION OF THE DRAWINGS

The above and other aspects and features of the present disclosure will become more apparent by describing aspects of some example embodiments thereof in more detail with reference to the attached drawings, in which.

DETAILED DESCRIPTION

Aspects of some example embodiments of the present invention will now be described more fully hereinafter with reference to the accompanying drawings, in which example embodiments of the invention are shown. This invention may, however, be embodied in different forms and should not be construed as limited to the embodiments set forth herein. Rather, these example embodiments are provided so that this disclosure will be thorough and complete, and will more fully convey the scope of the invention to those skilled in the art.

It will also be understood that when a layer is referred to as being "on" another layer or substrate, it can be directly on the other layer or substrate, or intervening layers may also be present. In contrast, when an element is referred to as being "directly on" another element, there are no intervening elements present.

The same reference numbers indicate the same components throughout the specification Hereinafter, embodiments of the present disclosure will be described with reference to the accompanying drawings.

In the disclosure herein, a first direction DR1 indicates a Y-axis direction, a second direction DR2 indicates an X-axis direction, and a third direction DR3 indicates a Z-axis direction.

Figure 1:
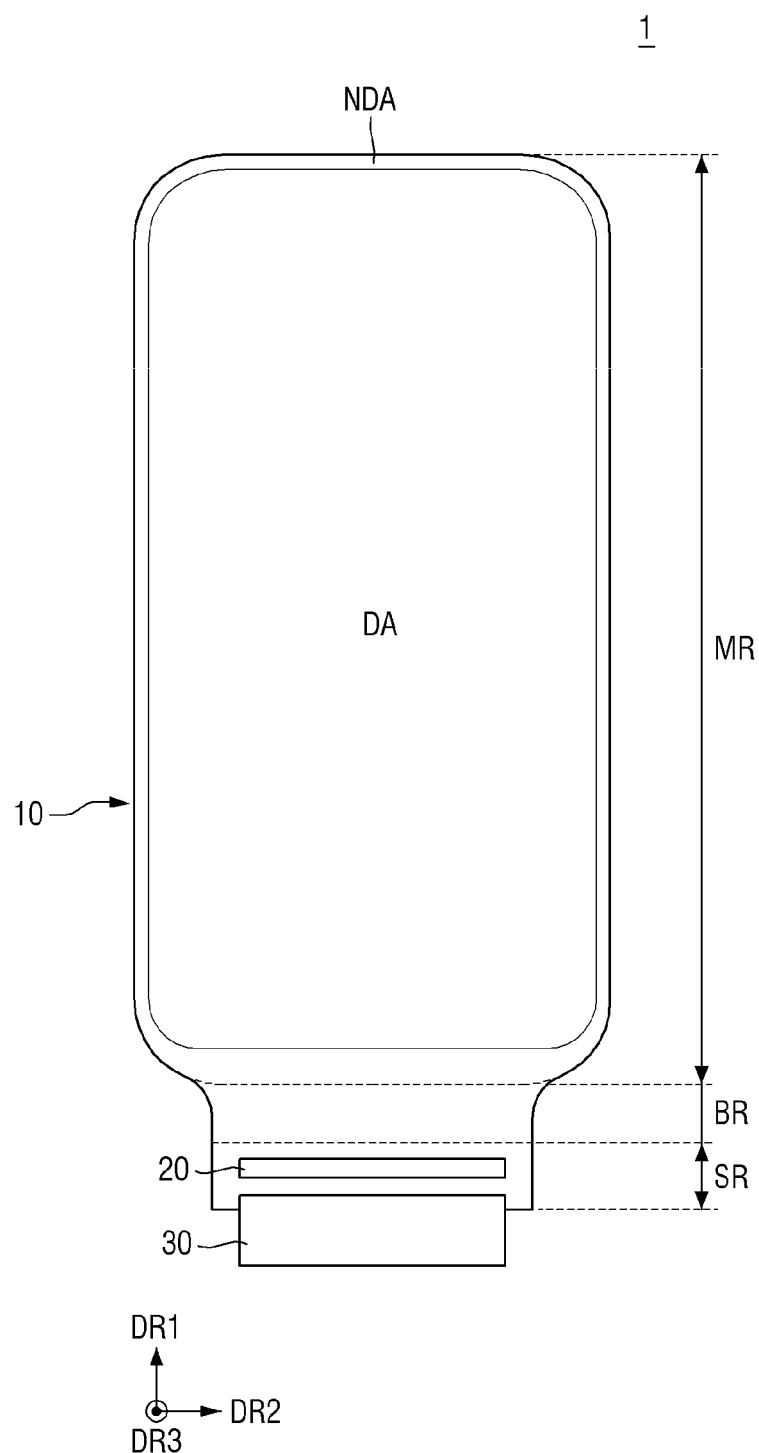
FIG. 1 is a plan view of a display device according to some example embodiments.
Figure 2:
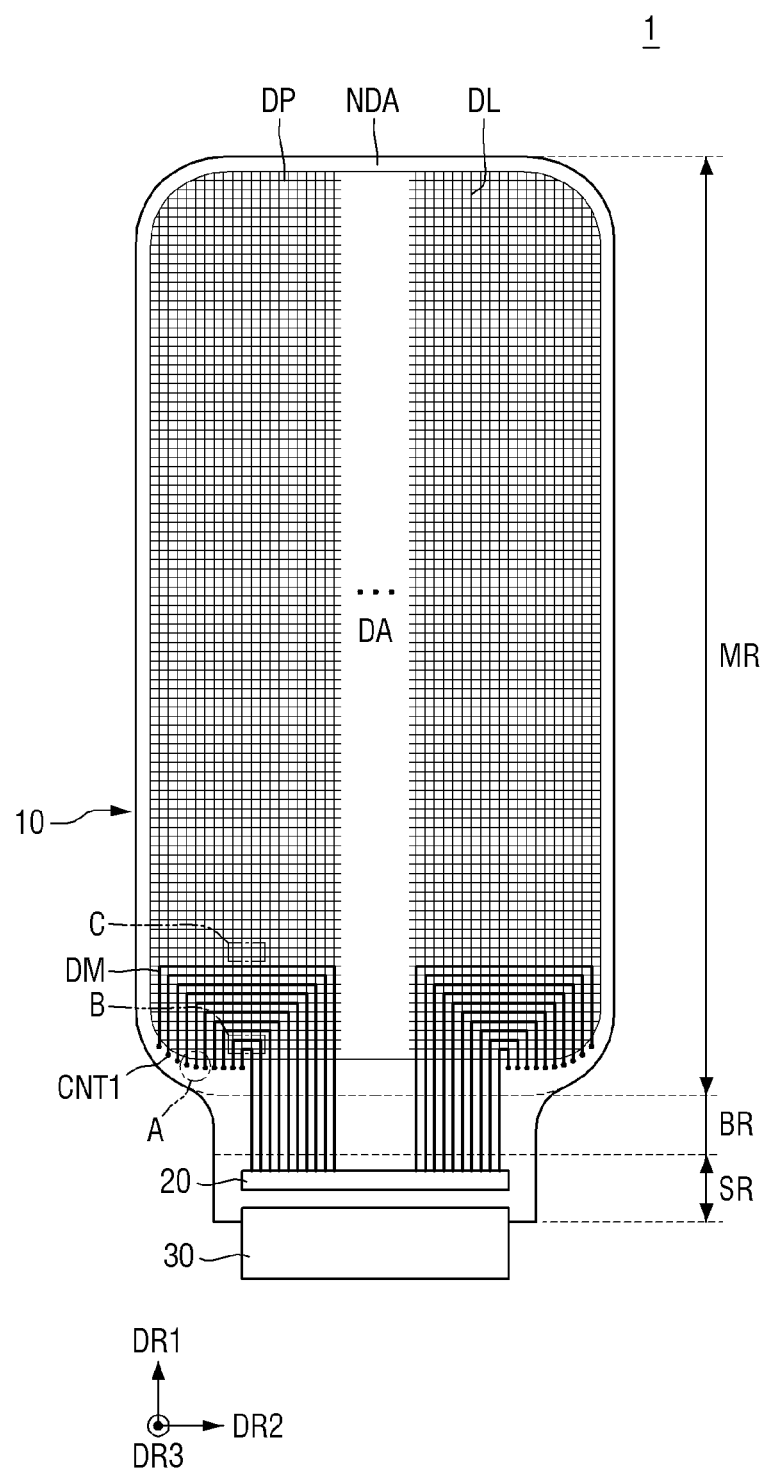
FIG. 2 is a plan view showing a signal line, a connection line, and a dummy line of the display device according to some example embodiments.
Figure 3:
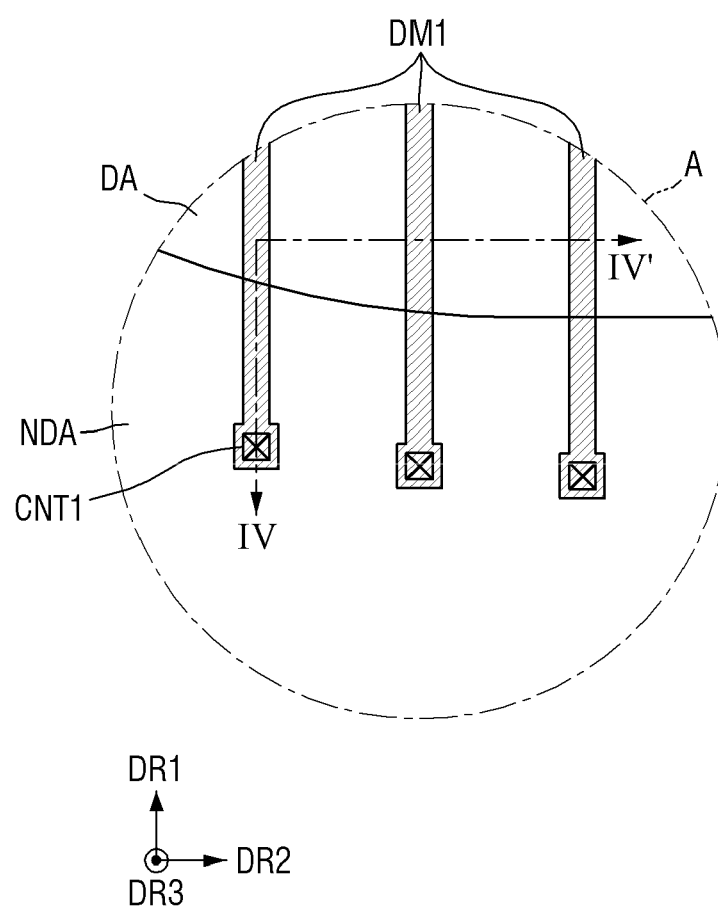
FIG. 3 is an enlarged plan view of the region A of FIG. 2.
Figure 4:
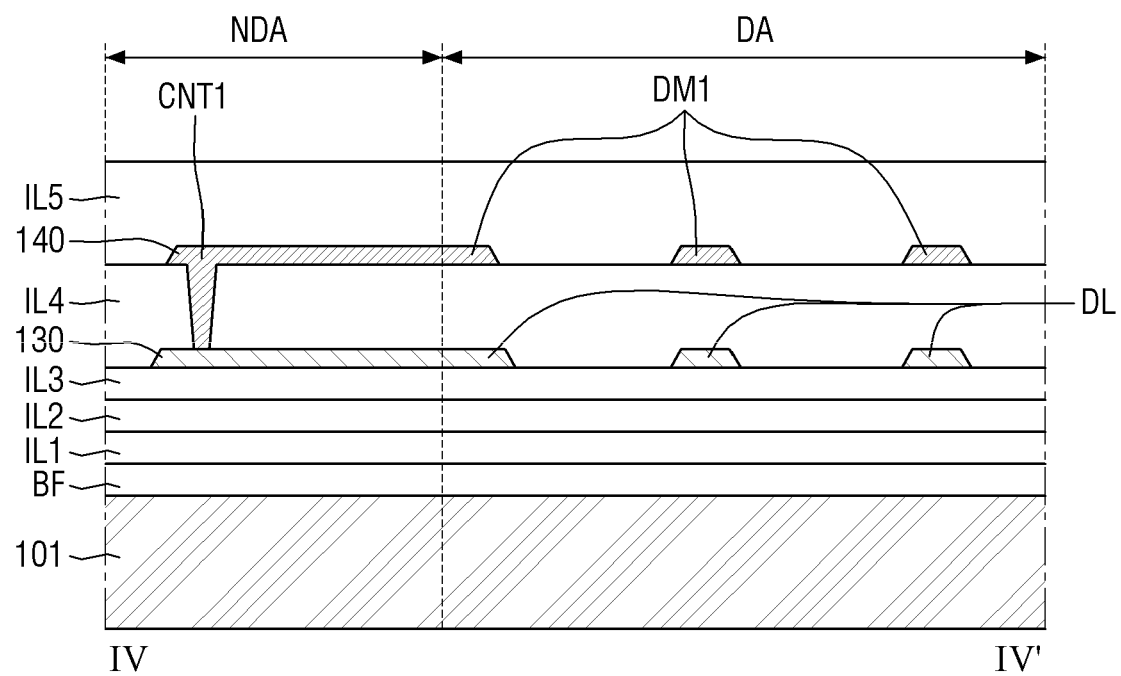
FIG. 4 is a sectional view taken along the line IV-IV' of FIG. 3.
Figure 5:
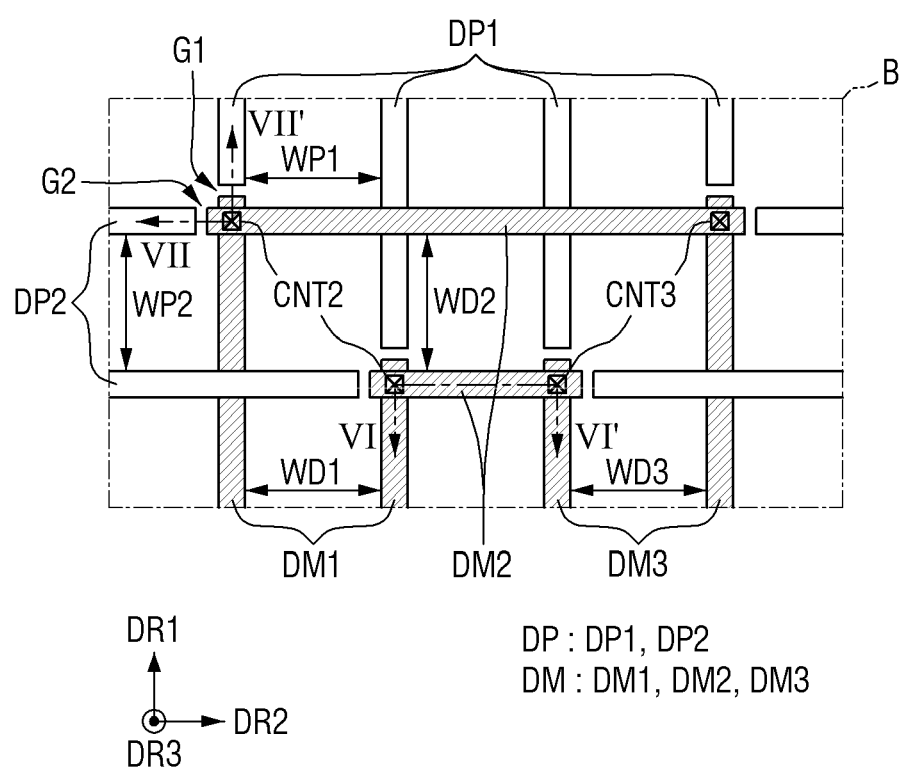
FIG. 5 is an enlarged plan view of the region B of FIG. 2.
Figure 6:
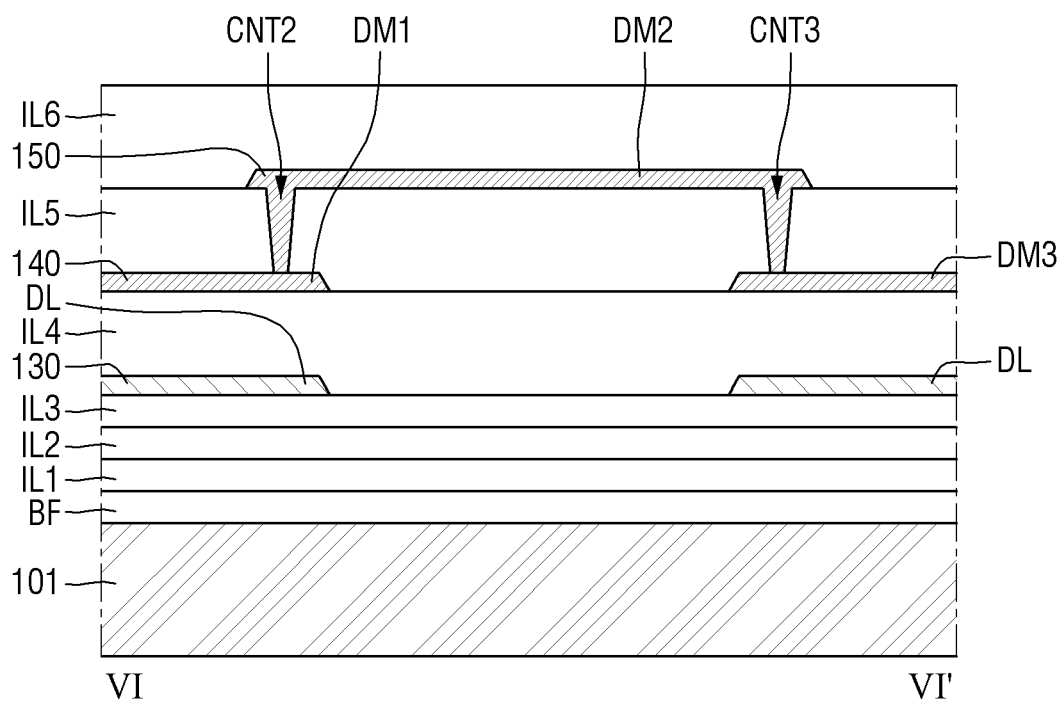
FIG. 6 is a sectional view taken along the line VI-VI' of FIG. 5.
Figure 7:
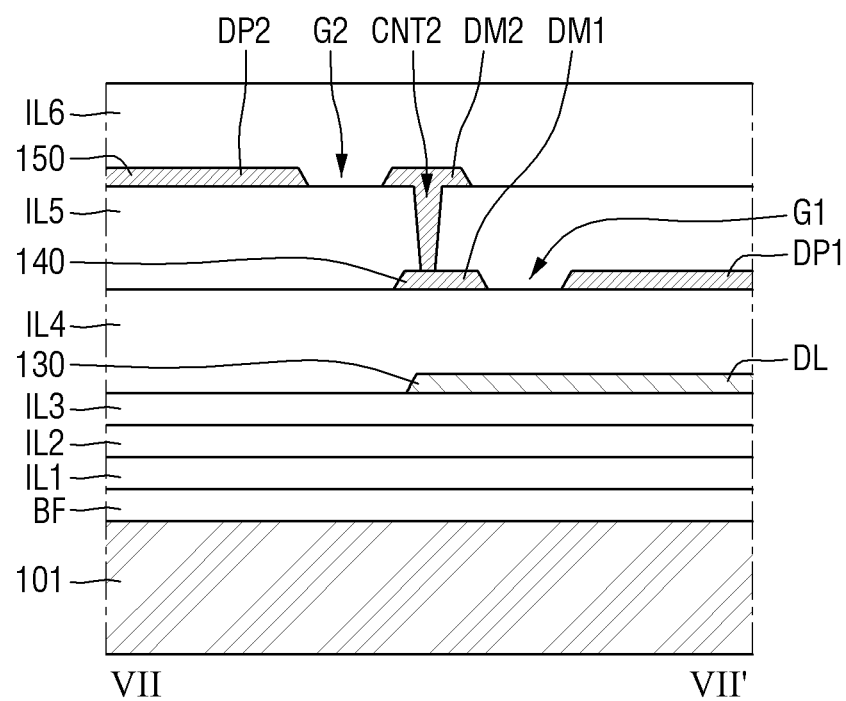
FIG. 7 is a sectional view taken along the line VII-VII' of FIG. 5.
Figure 8:
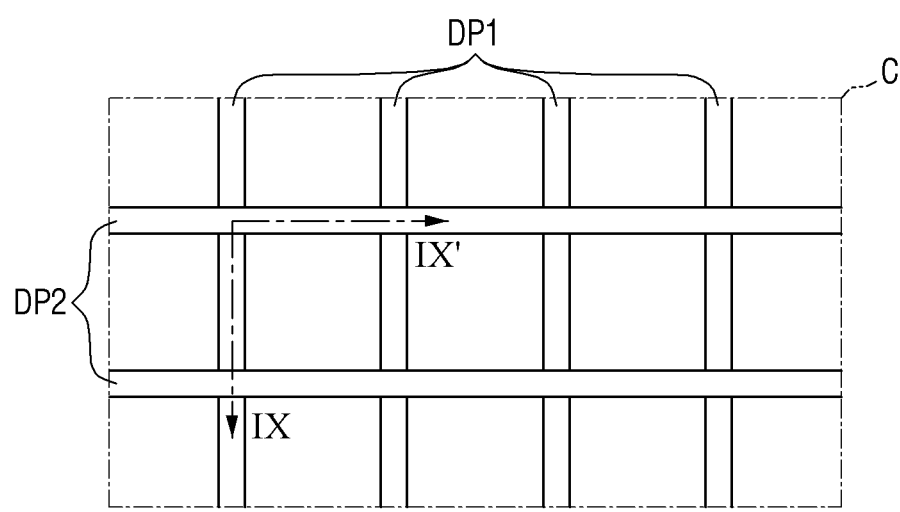
FIG. 8 is an enlarged plan view of the region C of FIG. 2.
Figure 8:
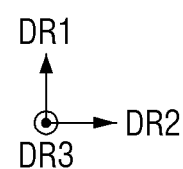
Figure 9:
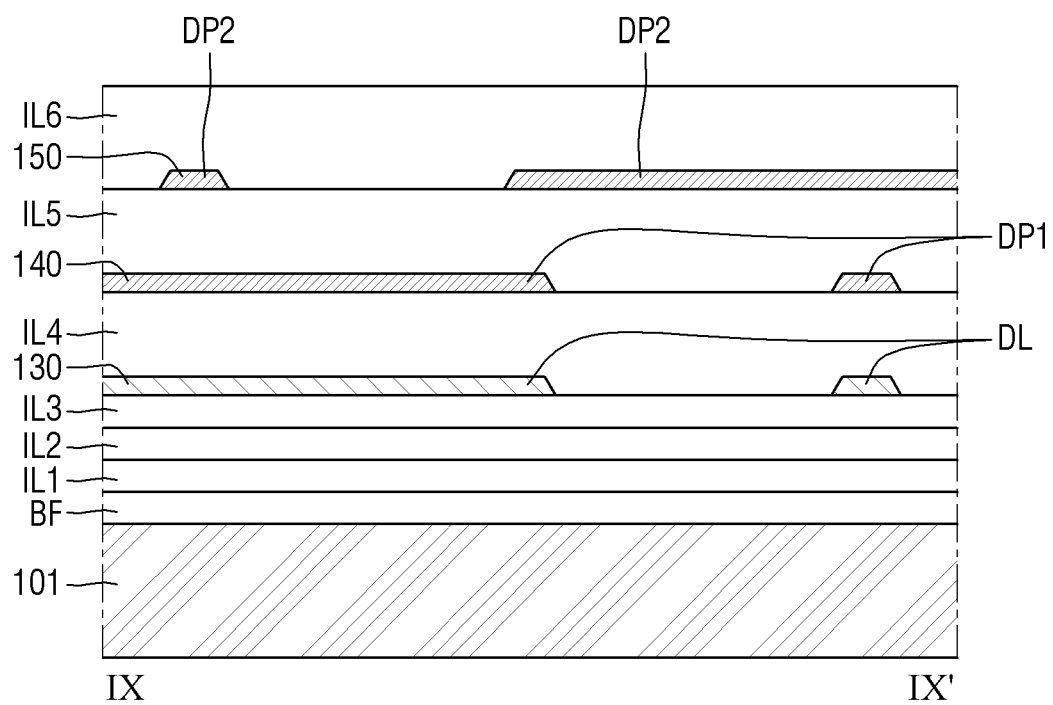
FIG. 9 is a sectional view taken along the line IX-IX' of FIG. 8.

FIG. 1 is a plan view of a display device according to some example embodiments. FIG. 2 is a plan view showing a signal line, a connection line, and a dummy line of the display device according to some example embodiments. FIG. 3 is an enlarged plan view of the region A of FIG. 2. FIG. 4 is a sectional view taken along the line IV-IV' of FIG. 3. FIG. 5 is an enlarged plan view of the region B of FIG. 2. FIG. 6 is a sectional view taken along the line VI-VI' of FIG. 5. FIG. 7 is a sectional view taken along the line VII-VII' of FIG. 5. FIG. 8 is an enlarged plan view of the region C of FIG. 2. FIG. 9 is a sectional view taken along the line IX-IX' of FIG. 8.

Referring to FIGS. 1 to 9, a display device 1 is a device configured to display a moving image or a still image. The display device 1 may be used as a display screen for various products such as a portable electronic apparatus such as a mobile phone, smart phone, tablet personal computer (PC), smart watch, watch phone, mobile communication terminal, electronic notebook, electronic book, portable multimedia player (PMP), navigation, or ultra mobile PC (UMPC), as well as a television, notebook computer, monitor, signboard, or Internet of Things devices.

The display device 1 may include a display panel 10. The display panel 10 may be a flexible substrate including a flexible polymer material such as polyimide. Accordingly, the display panel 10 may be curved, bent, folded, or rolled up.

The display panel 10 may include a main region MR and a bending region BR connected to one side of the main region MR. The display panel 10 may further include a sub region SR connected to the bending region BR and overlapping the main region MR in a thickness direction.

The display panel 10 may include a display area DA, which is a portion in which an image is displayed and a non-display area NDA excluding the display area DA. The display area DA may include a plurality of pixels. Each pixel may include a light emitting layer and a circuit layer for controlling a light emitting amount of the light emitting layer. The circuit layer may include display lines, display electrodes, and at least one transistor. The light emitting layer may include an organic light emitting material. The light emitting layer may be sealed by an encapsulation layer. The detailed configuration of the pixel will be described later.

The display area DA is located in the main region MR. The peripheral edge portion of the display area DA in the main region MR, the bending region BR, and the sub region SR may be the non-display area NDA. However, embodiments according to the present disclosure are not limited thereto, and the bending region BR and the sub region SR may also include the display area DA.

The main region MR may have a shape similar to an appearance of the display device 1 when viewed from the top. The main region MR may be a flat region located on one surface thereof. However, embodiments according to the present disclosure are not limited thereto, and at least one of edges other than edges (sides) connected to the bending region BR in the main region MR may be formed as a curved surface or bent in a vertical direction.

When the at least one of edges other than edges (sides) connected to the bending region BR in the main region MR is formed as a curved surface or bent, the display area DA may also be located at the corresponding edge. However, embodiments according to the present disclosure are not limited thereto, and the non-display area NDA, which does not display the image, may be located at the curved or bent edge, or the display area DA and the non-display area NDA may be arranged together at the curved or bent edge.

The non-display area NDA may be located around the display area DA of the main region MR. The non-display area NDA of the main region MR may be located in an area from an outer boundary of the display area DA to the edges of the display panel 10. A signal line DL, a connection line DM, or driving circuits configured to apply a signal to the display area DA may be located in the non-display area NDA of the main region MR. In addition, an outermost black matrix may be located in the non-display area NDA of the main region MR, but embodiments according to the present disclosure are not limited thereto.

The bending region BR is connected to the main region MR. For example, the bending region BR may be connected through one short side of the main region MR. In the bending region BR, the display panel 10 may be bent with a curvature in a direction opposite to a third direction DR3, that is, in a direction opposite to a display surface. When the display panel 10 is bent in the bending region BR, the surface of the display panel 10 may be reversed. In other words, the surface may be changed such that one surface of the display panel 10 facing upward faces outward through the bending region BR and then faces downward.

The sub region SR extends from the bending region BR. The sub region SR may start from a portion where the bending is completed and extend in a direction parallel to the main region MR. The sub region SR may overlap the main region MR in the third direction DR3 of the display panel 10, that is, in a thickness direction. The sub region SR may overlap the non-display area NDA at the edge of the main region MR and may further overlap the display area DA of the main region MR.

A width of the sub region SR in the second direction DR2 may be equal to a width of the bending region BR in the second direction DR2 but is not limited thereto.

A driving chip 20 may be located on the sub region SR of the display panel 10. The driving chip 20 may generate a driving signal required for driving the pixel and supply the driving signal to the pixel defined in the display area DA. For example, the driving chip 20 may generate a data signal to determine an emission luminance of the pixel. In this case, the driving chip 20 may provide the data signal to the pixel through the connection lines DM and the signal lines DL.

The driving chip 20 may be attached onto the display panel 10 through an anisotropic conductive film or attached onto the display panel 10 through ultrasonic bonding. A width of the driving chip 20 in the second direction DR2 may be smaller than a width of the display panel 10 in the second direction DR2.

A driving substrate 30 may be connected to an end of the sub region SR of the display panel 10. A pad portion may be provided at the end of the sub region SR, and the driving substrate 30 may be connected to the pad portion. The driving substrate 30 may be a flexible printed circuit board or film.

A plurality of signal lines DL, connection lines DM, or dummy lines DP may be located in the sub region SR, the bending region BR, and the main region MR. The signal lines DL and the connection lines DM may extend from the sub region SR to the main region MR via the bending region BR. The dummy lines DP may be located in the main region MR.

The signal lines DL, the connection lines DM, and the dummy lines DP will be described in more detail with reference to FIGS. 2 to 9.

Referring to FIGS. 2 to 9, the display device 1 may include a plurality of signal lines DL, a plurality of connection lines DM, and a plurality of dummy lines DP. Meanwhile, the signal lines DL, the connection lines DM, and the dummy lines DP are configured to extend in the first direction DR1 or the second direction DR2 and may be symmetrical with respect to a reference axis (not shown) formed through a center of an area of the display device 1. Hereinafter, the description will be focused on the signal lines DL, the connection lines DM, and the dummy lines DP that are located on a left side of the display device 1.

The signal lines DL may extend from the non-display area NDA and be located in the display area DA. The signal lines DL may extend in the first direction DR1 and may be sequentially arranged at specific intervals along the second direction DR2. The second direction DR2 refers to a direction intersecting the first direction DR1 and may be perpendicular to the first direction DR1.

One end of the signal line DL may be electrically connected to the connection line DM. One end of the signal line DL connected to the connection line DM may be located in the non-display area NDA below the main region MR. The signal line DL may be, for example, a data line that transmits a data signal.

The plurality of connection lines DM may extend from the non-display area NDA and extend to the non-display area NDA via the display area DA. The connection lines DM may include first connection lines DM1 connected to the signal lines DL, respectively; second connection lines DM2 connected to the first connection lines DM1, respectively; and third connection lines DM3 connected to the second connection lines DM2, respectively.

The plurality of first connection lines DM1 may extend from the non-display area NDA and be located in the display area DA. The first connection lines DM1 may extend in the first direction DR1 and may be sequentially arranged at specific intervals along the second direction DR2. An interval between the plurality of first connection lines DM1 may be substantially the same as an interval between the signal lines DL.

One end of the first connection line DM1 may be located in the non-display area NDA, and the other end of the first connection line DM1 may be located in the display area DA. The one end of the first connection line DM1 may extend to one end of the signal line DL located in the non-display area NDA below the main region MR. The one end of the first connection line DM1 may be electrically connected to each signal line DL in the non-display area NDA below the main region MR.

The first connection line DM1 may be located on a different layer from a layer on which the signal line DL is located and may be insulated from the signal line DL by an insulating layer. For example, as shown in FIG. 4, the signal line DL may be formed of a first conductive layer 130, the first connection line DM1 may be formed of a second conductive layer 140, and the signal line DL may be insulated from the first connection line DM1 by a fourth insulating layer IL4. The one end of the first connection line DM1 may pass through the fourth insulating layer IL4 and be electrically connected to the signal line DL through a first contact hole CNT1 exposing one end of the signal line DL.

Meanwhile, FIGS. 2 to 4 illustrate that the first connection line DM1 overlaps the signal line DL in the thickness direction, but embodiments according to the present disclosure are not limited thereto. In other words, the first connection line DM1 may be arranged to not overlap the signal line DL when viewed from the top. In this case, the first connection line DM1 may be located in a space where the plurality of signal lines DL are spaced apart from each other.

The plurality of second connection lines DM2 may be located in the display area DA. The second connection lines DM2 may extend in the second direction DR2 and may be sequentially arranged at specific intervals along the first direction DR1. One end of the second connection line DM2 may extend to the other end of the first connection line DM1 located in the display area DA. The one end of the second connection line DM2 may be electrically connected to the other end of each first connection line DM1 in the display area DA.

The second connection line DM2 may be located on a different layer from the layer on which the first connection line DM1 is located and may be insulated from the first connection line DM1 by an insulating layer. For example, as shown in FIG. 6, the first connection line DM1 may be formed of a second conductive layer 140, the second connection line DM2 may be formed of a third conductive layer 150, and the first connection line DM1 may be insulated from the second connection line DM2 by a fifth insulating layer IL5. The one end of the second connection line DM2 may pass through the fifth insulating layer IL5 and be electrically connected to the first connection line DM1 through a second contact hole CNT2 exposing the other end of the first connection line DM1.

The plurality of third connection lines DM3 may extend from the non-display area NDA and be located in the display area DA. The third connection line DM3 may extend in the first direction DR1 and may be sequentially arranged at specific intervals along the second direction DR2. An interval WD3 between the third connection lines DM3 may be substantially the same as an interval WD1 between the first connection lines DL1.

One end of the third connection line DM3 may be located in the display area DA, and the other end of the third connection line DM3 may be located in the non-display area NDA. The one end of the third connection line DM3 may extend to the other end of the second connection line DM2. The one end of the third connection line DM3 may be electrically connected to the other end of the second connection line DM2 in the display area DA.

The third connection line DM3 may be located on a different layer from the layer on which the second connection line DM2 is located and may be insulated from the second connection line DM2 by an insulating layer. In addition, the third connection line DM3 may be located on the same layer as the layer on which the first connection lines DM1 are located. For example, as shown in FIG. 6, the second connection line DM2 may be formed of a third conductive layer 150, the third connection line DM3 may be formed of the second conductive layer 140, and the second connection line DM2 may be insulated from the third connection line DM3 by the fifth insulating layer IL5. The other end of the second connection line DM2 may pass through the fifth insulating layer IL5 and be electrically connected to the third connection line DM3 through a third contact hole CNT3 exposing the one end of the third connection line DM3.

Meanwhile, FIGS. 2 and 5 illustrate that the third connection line DM3 overlaps the signal line DL in the thickness direction but embodiments according to the present disclosure are not limited thereto. In other words, the third connection line DM3 may be arranged to not overlap the signal line DL when viewed from the top. In this case, the third connection line DM3 may be located in a space where the plurality of signal lines DL are spaced apart from each other.

As described above, the display device 1 may include first to third connection lines DM1, DM2 and DM3 located via the display area DA and provide an image signal to the signal lines DL through the first to third connection lines DM1, DM2 and DM3. Accordingly, an additional dead space required for connecting the signal lines DL to the driving chip 20 may be unnecessary. In other words, the dead space may be minimized or reduced.

The plurality of dummy lines DP may be located over the display area DA of the main region MR. The dummy line DP may include a plurality of first dummy lines DP1 and a plurality of second dummy lines DP2.

The plurality of first dummy lines DP1 may extend in the first direction DR1 and may be sequentially arranged at specific intervals along the second direction DR2. An interval WP1 between the first dummy lines DP1 may be substantially the same as the interval WD1 between the first connection lines DM1. In addition, the interval WP1 between the first dummy lines DP1 may be substantially the same as the interval WD3 between the third connection lines DL3.

The first dummy lines DP1 may be aligned with the first connection lines DM1 and/or the third connection lines DM3 in the first direction DR1. The first dummy line DP1 may partially overlap the second connection line DM2.

One end of the first dummy line DP1 may be spaced apart from one end or the other end of the first connection line DM1 and/or the third connection line DM3. The one end of the first dummy line DP1 may face the one end or the other end of the first connection line DM1 and/or the third connection line DM3. A first gap G1 may be defined at a space in which the one end of the first dummy line DP1 is spaced apart from and faces the one end or the other end of the first connection line DM1 and/or the third connection line DM3.

The first dummy line DP1 may be located on the same layer as the layer on which the first connection lines DM1 and/or the third connection lines DM3 are located. In addition, the first dummy line DP1 may be located on a different layer from the layer on which the second connection lines DM2 are located. For example, as shown in FIGS. 7 and 9, the first dummy line DP1 may be formed of the second conductive layer 140.

Meanwhile, FIGS. 5 and 7 to 9 illustrate that the first dummy line DP1 overlaps the signal line DL in the thickness direction but embodiments according to the present disclosure are not limited thereto. In other words, the first dummy line DP1 may be arranged to not overlap the signal line DL when viewed from the top. In this case, the first dummy line DP1 may be located in a space where the plurality of signal lines DL are spaced apart from each other.

The plurality of second dummy lines DP2 may extend in the second direction DR2 and may be sequentially arranged at specific intervals along the first direction DR1. An interval WP2 between the second dummy lines DP2 may be substantially the same as an interval WD2 between the second connection lines DM2.

The plurality of second dummy lines DP2 may be located at one side and the other side of the second connection line DM2 when viewed from the top. In other words, the second connection lines DM2 may be located between the plurality of second dummy lines DP2 when viewed from the top. The second dummy lines DP2 may be aligned with the second connection lines DM2 in the second direction DR2. The second dummy lines DP2 may partially overlap the first connection lines DM1 and/or the third connection lines DM3.

One end or the other end of the second dummy line DP2 may be spaced apart from one end or the other end of the second connection line DM2. A second gap G2 may be defined at a space in which the one end or the other end of the second dummy line DP2 is spaced apart from the one end or the other end of the second connection line DM2.

The second dummy line DP2 may be located on a different layer from the layer on which the first dummy lines DP1 are located. In addition, the second dummy line DP2 may be located on a different layer from the layer on which the first connection lines DM1 and/or the third connection lines DM3 are located. In addition, the second dummy line DP2 may be located on the same layer as the layer on which the second connection lines DM2 are located. For example, as shown in FIGS. 7 and 9, the second dummy line DP2 may be formed of the third conductive layer 150.

As described above, when the dummy lines DP1 and DP2 include a plurality of conductive layers, and when the first dummy lines DP1 extend in the first direction DR1 and the second dummy lines DP2 extend in the second direction DR2, the dummy lines DP1 and DP2 may implement a lattice pattern shape together with the connection lines DM1, DM2 and DM3. Accordingly, variant patterns are minimized or reduced so that visual recognition of the pattern can be prevented or reduced.

Hereinafter, a pixel P of the display device 1 will be described in more detail.

Figure 10:
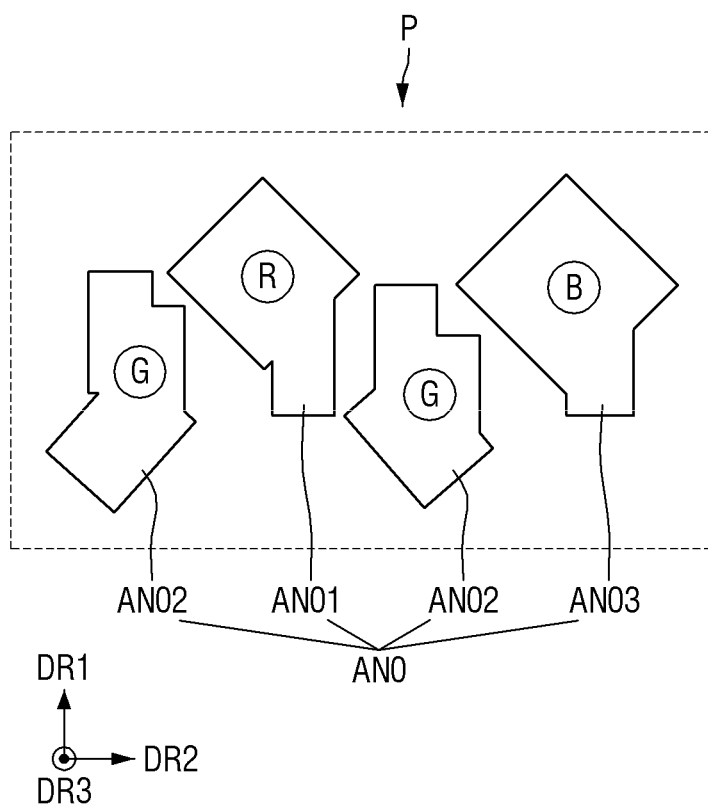
FIG. 10 is a plan view showing an arrangement of pixels according to some example embodiments.
Figure 11:
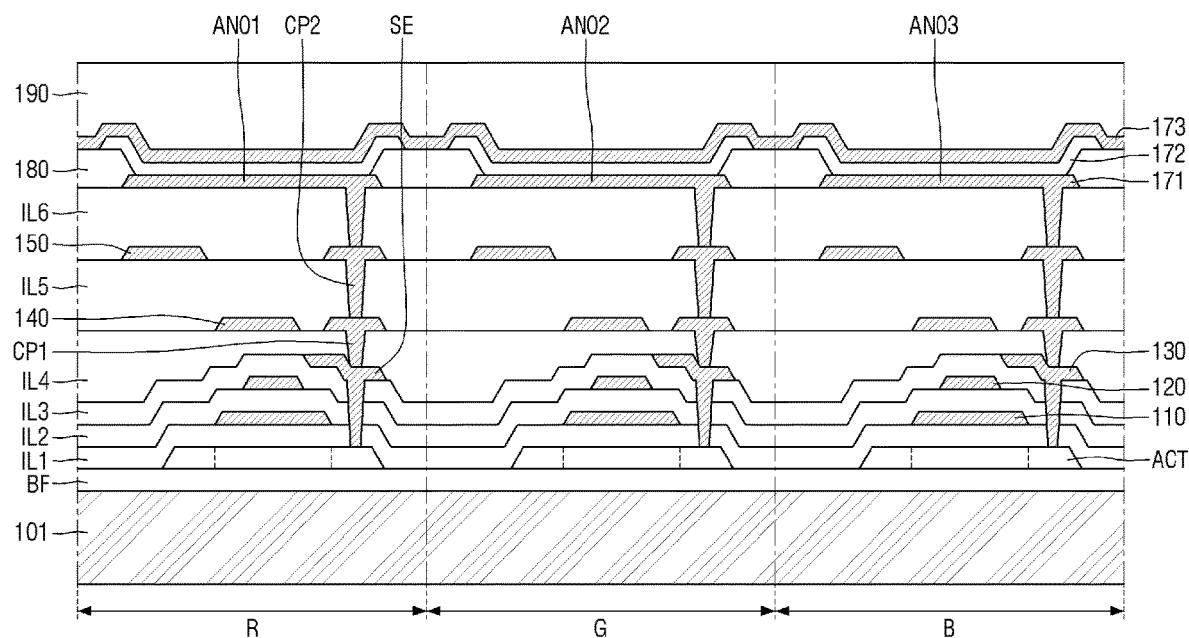
FIG. 11 is a sectional view showing an example of a pixel of FIG. 10.

FIG. 10 is a plan view showing an arrangement of pixels according to an embodiment. FIG. 11 is a sectional view showing an example of the pixel of FIG. 10.

Referring to FIGS. 10 and 11, each pixel P may include sub-pixels R, G and B. The sub-pixels R, G and B may include a first sub-pixel R emitting a first color, a second sub-pixel G emitting a second color, and a third sub-pixel B emitting a third color. One first sub-pixel R, two second sub-pixels G, and one third sub-pixel B may be defined as one pixel P. The pixel P refers to a group of sub-pixels capable of representing a gray scale. FIG. 10 illustrates that the second sub-pixel G, the first sub-pixel R, the second sub-pixel G, and the third sub-pixel B are sequentially arranged in the second direction DR2. However, the arrangement of the sub-pixels R, G and B is not limited thereto.

Each sub-pixel R, G and B may have a different shape and size. FIG. 10 illustrates that the third sub-pixel B has the largest size and the second sub-pixel G has the smallest size. However, the sizes of the sub-pixels R, G and B are not limited thereto.

An anode electrode ANO may be arranged corresponding to each of the sub-pixels R, G and B. The anode ANO may include first to third anode electrodes ANO1, ANO2 and ANO3 corresponding to each of the sub-pixels R, G and B. The first anode electrode ANO1 may be arranged corresponding to the first sub-pixel R, the second anode electrode ANO2 may be arranged corresponding to the second sub-pixel G, and the third anode electrode ANO3 may be arranged corresponding to the third sub-pixel B.

A sectional structure of each sub-pixel R, G and B will be described in more detail with reference to FIG. 11. In FIG. 11, new reference numerals are additionally given to and occasionally written together with some components to clarify the interlayer configuration for the same configuration as the aforementioned components.

Referring to FIG. 11, each sub-pixel R, G and B may include a substrate 101, a buffer layer BF, a semiconductor layer ACT, a first insulating layer IL1, a first gate conductive layer 110, a second insulating layer IL2, a second gate conductive layer 120, a third insulating layer IL3, a first conductive layer 130, a fourth insulating layer IL4, a second conductive layer 140, a fifth insulating layer IL5, a third conductive layer 150, a sixth insulating layer IL6, a first electrode 171, a pixel defining layer 180 including an opening exposing the first electrode 171, a light emitting layer 172 located in the opening of the pixel defining layer 180, a second electrode 173 located on the light emitting layer 172 and the pixel defining layer 180, and a passivation layer 190.

Each of the above-described layers may be composed of a single layer and may be composed of a laminated layer including a plurality of layers. Another layer may be further located between the layers.

The substrate 101 may support the layers located thereon. The substrate 101 may be formed of an insulating material. The substrate 101 may be formed of an inorganic material such as glass or quartz or may be formed of an organic material such as polyimide. The substrate 101 may be a rigid substrate or a flexible substrate.

The buffer layer BF is located on the substrate 101. The buffer layer BF may prevent or reduce instances of impurity ions diffusing, prevent or reduce instances of moisture permeating, and function as a surface planarization. The buffer layer BF may include silicon nitride, silicon oxide, silicon oxynitride, or the like.

The semiconductor layer ACT is located on the buffer layer BF. The semiconductor layer ACT may form channels of a plurality of transistors of each sub-pixel R, G and B. The semiconductor layer ACT may include polycrystalline silicon. The polycrystalline silicon may be formed by crystallizing amorphous silicon.

When the semiconductor layer ACT is formed of polycrystalline silicon and ions are doped into the semiconductor layer ACT, the semiconductor layer ACT doped with the ions may have conductivity. Accordingly, the semiconductor layer ACT may include not only channel areas of a plurality of transistors but also a source area and a drain area. The source area and the drain area may be connected to both sides of each channel area.

In another embodiment, the semiconductor layer ACT may include single-crystalline silicon, low temperature polycrystalline silicon, amorphous silicon, or an oxide semiconductor. The oxide semiconductor may include, for example, a binary compound ($AB_x$), a ternary compound ($AB_xC_y$), and a quaternary compound ($AB_xC_yD_z$) that contain indium, zinc, gallium, tin, titanium, aluminum, hafnium (Hf), zirconium (Zr), magnesium (Mg), or the like. In one embodiment, the semiconductor layer ACT may include oxide including indium, tin and titanium (ITZO) or oxide including indium, gallium and tin (IGZO).

The first insulating layer IL1 is located on the semiconductor layer ACT. The first insulating layer IL1 may be substantially arranged over an entire surface of the substrate 101. The first insulating layer IL1 may be a gate insulating layer having a gate insulating function. The first insulating layer IL1 may include a silicon compound, a metal oxide, and the like. For example, the first insulating layer IL1 may include silicon oxide, silicon nitride, silicon oxynitride, aluminum oxide, tantalum oxide, hafnium oxide, zirconium oxide, titanium oxide, and the like. The first insulating layer IL1 may be a single layer or a multilayer layer composed of laminated layers formed of different materials.

The first gate conductive layer 110 is located on the first insulating layer IL1. The first gate conductive layer 110 may include at least one metal selected from the group including molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first gate conductive layer 110 may be a single layer or a multilayer layer. The first gate conductive layer 110 may include a gate electrode of a transistor and a first electrode of a storage capacitor.

The second insulating layer IL2 is located on the first gate conductive layer 110. The second insulating layer IL2 may be substantially located over an entire surface of the substrate 101. The second insulating layer IL2 serves to insulate the first gate conductive layer 110 from the second gate conductive layer 120.

The second insulating layer IL2 may be an interlayer insulating layer. The second insulating layer IL2 may include the same material as the above-described first insulating layer IL1 or may include at least one material selected from materials listed as example constituent materials of the first insulating layer IL1.

The second gate conductive layer 120 is located on the second insulating layer IL2. The second gate conductive layer 120 may include a second electrode of the storage capacitor. The second gate conductive layer 120 may overlap the first gate conductive layer 110 with the second insulating layer IL2 interposed therebetween so as to form a storage capacitor. The second gate conductive layer 120 may include at least one metal selected from the group including molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The second gate conductive layer 120 may be formed of the same material as the first gate conductive layer 110 but is not limited thereto. The second gate conductive layer 120 may be a single layer or a multilayer layer.

The third insulating layer IL3 covers the second gate conductive layer 120. The third insulating layer IL3 insulates the second gate conductive layer 120 and the first conductive layer 130. The third insulating layer IL3 may include the same material as the above-described first insulating layer IL1 or may include at least one material selected from materials listed as example constituent materials of the first insulating layer IL1.

The first conductive layer 130 is located on the third insulating layer IL3. The first conductive layer 130 may include at least one metal selected from the group including aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer 130 may be a single layer or a multilayer layer. For example, the first conductive layer 130 may be formed of a laminated structure such as Ti/Al/Ti, Mo/Al/Mo, Mo/AlGe/Mo, or Ti/Cu. The first conductive layer 130 may include the above-described signal line DL and a source electrode SE. The source electrode SE may be connected to the source area of the semiconductor layer ACT through the contact hole formed through the third insulating layer IL3, the second insulating layer IL2, and the first insulating layer IL1.

The fourth insulating layer IL4 covers the first conductive layer 130. The fourth insulating layer IL4 may be a via layer. The fourth insulating layer IL4 may include an organic insulating material such as a polyacrylate resin, an epoxy resin, a phenolic resin, a polyamide resin, a polyimide rein, an unsaturated polyester resin, a polyphenylene ether resin, a polyphenylene sulfide resin, or benzocyclobutene (BCB).

The second conductive layer 140 is located on the fourth insulating layer IL4. The second conductive layer 140 may include the same material as the above-described first conductive layer 130 or may include at least one material selected from materials listed as example constituent materials of the first conductive layer 130. The second conductive layer 140 may include the first connection line DM1, the third connection line DM3 and the first dummy line DP1 described above, and a first conductive pattern CP1. The first conductive pattern CP1 may be connected to the source electrode SE through a contact hole formed through the fourth insulating layer IL4.

The fifth insulating layer IL5 covers the second conductive layer 140. The fifth insulating layer IL5 may be a via layer. The fifth insulating layer IL5 may include the same material as the above-described fourth insulating layer IL4 or may include at least one material selected from materials listed as example constituent materials of the fourth insulating layer IL4.

The third conductive layer 150 is located on the fifth insulating layer IL5. The third conductive layer 150 may include the same material as the above-described first conductive layer 130 or may include at least one material selected from materials listed as example constituent materials of the first conductive layer 130. The third conductive layer 150 may include the second connection line DM2 and the second dummy line DP2 described above and a second conductive pattern CP2. The second conductive pattern CP2 may be connected to the first conductive pattern CP1 through a contact hole formed through the fifth insulating layer IL5.

The sixth insulating layer IL6 covers the third conductive layer 150. The sixth insulating layer IL6 may be a via layer. The sixth insulating layer IL6 may include the same material as the above-described fourth insulating layer IL4 or may include at least one material selected from materials listed as example constituent materials of the fourth insulating layer IL4.

The first electrode 171 is located on the sixth insulating layer IL6. Although not limited to the following, the first electrode 171 may have a laminated layer structure formed by laminating a material layer having a high work function such as indium-tin-oxide (ITO), indium-zinc-oxide (IZO), zinc oxide (ZnO), or indium oxide (In$_2$O$_3$), and a reflective material layer such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca) or a mixture thereof. The layer having a higher work function may be located above the reflective material layer so as to be closer to the light emitting layer 172. The first electrode 171 may have a multilayer structure of ITO/Mg, ITO/MgF, ITO/Ag, or ITO/Ag/ITO but is not limited thereto. The anode electrodes ANO1, ANO2 and ANO3 of each sub-pixel R, G and B may be formed of the first electrode 171. The anodes ANO1, ANO2 and ANO3 may be connected to the second conductive pattern CP2 through a contact hole formed through the sixth insulating layer IL6.

The pixel defining layer 180 may be located on the first electrode 171. The pixel defining layer 180 may include an inorganic insulating material such as silicon oxide, silicon nitride, silicon oxynitride, hafnium oxide, aluminum oxide, titanium oxide, tantalum oxide, or zinc oxide, or an organic insulating material such as a polyacrylate resin, an epoxy resin, a phenolic resin, a polyamide resin, a polyimide rein, an unsaturated polyester resin, a polyphenylene ether resin, a polyphenylene sulfide resin, or BCB. The pixel defining layer 180 may be a single layer or a multilayer layer composed of laminated layers formed of different materials.

The pixel defining layer 180 may include an opening that exposes the first electrode 171. The opening may define a light emitting area of each sub-pixel R, G and B. The second conductive layer 140 and the third conductive layer 150, which are located below the light emitting area of each sub-pixel R, G and B may be designed in an equivalent pattern. In other words, a location and width overlapped between the light emitting area of each sub-pixel R, G and B and the second conductive layer 140 may be substantially the same. In addition, a location and width overlapped between the light emitting area of each sub-pixel R, G and B and the third conductive layer 150 may be substantially the same. In this case, a step difference in light emitting areas of a plurality of sub-pixels R, G and B may be minimized or reduced. Accordingly, color deviations of the plurality of sub-pixels R, G and B may be improved. The second conductive layer 140 located below the light emitting area of each sub-pixel R, G and B may be one of the first connection line DM1, the third connection line DM3, and the first dummy line DP1 described above. In addition, the third conductive layer 150 located below the light emitting area of each sub-pixel R, G and B may be one of the second connection line DM2 and the second dummy line DP2 described above.

The light emitting layer 172 is located in the opening of the pixel defining layer 180. The light emitting layer 172 may include an organic light emitting layer, a hole injection/transport layer, and an electron injection/transport layer.

The second electrode 173 is located on the light emitting layer 172 and the pixel defining layer 180. A cathode electrode CAT may be formed of the second electrode 173. The cathode electrode CAT may be located over the entire display area DA. The second electrode 173 may include a material layer having a low work function such as Li, Ca, LiF/Ca, LiF/Al, Al, Mg, Ag, Pt, Pd, Ni, Au, Nd, Ir, Cr, BaF, Ba, or a compound or mixture thereof (for example, a mixture of Ag and Mg). The second electrode 173 may further include a transparent metal oxide layer located on the material layer having a low work function.

The passivation layer 190 may be located on the second electrode 173. The passivation layer 190 may prevent or reduce moisture or oxygen permeating into the light emitting layer 172. The passivation layer 190 may include at least one inorganic layer and/or organic layer. The inorganic layer may include at least one inorganic material among, for example, AlxOy, TiOx, ZrOx, SiOx, AlOxNy, AlxNy, SiOxNy, SixNy, ZnOx, and TaxOy. The organic layer may be formed by polymerizing at least one monomer selected from the group including, for example, pentabromophenyl acrylate, [2-(9H-carbazol-9-yl) ethylmethacrylate, N-vinylcarbazole, bis (methacryloylthiophenyl) sulfide, and zirconium acrylate. The organic layer may be a planarization layer.

As described above, the second conductive layer 140 and the third conductive layer 150, which are located below the light emitting area of each sub-pixel R, G and B may be designed in an equivalent pattern. Accordingly, a step difference in light emitting areas of a plurality of sub-pixels R, G and B may be minimized or reduced, and color deviations of the plurality of sub-pixels R, G and B may be improved.

Hereinafter, another embodiment will be described. Hereinafter, the same reference numerals will refer to the same components as those described above, and duplicate descriptions will be omitted or simplified.

Figure 12:
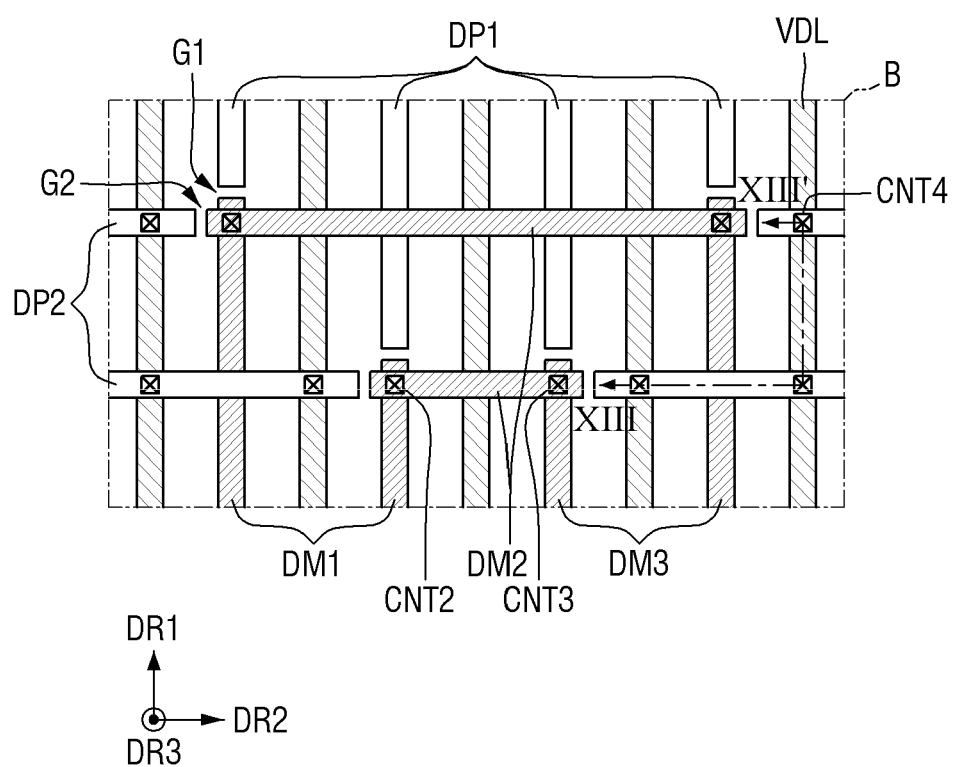
FIG. 12 is an enlarged plan view of region B according to some example embodiments.
Figure 13:
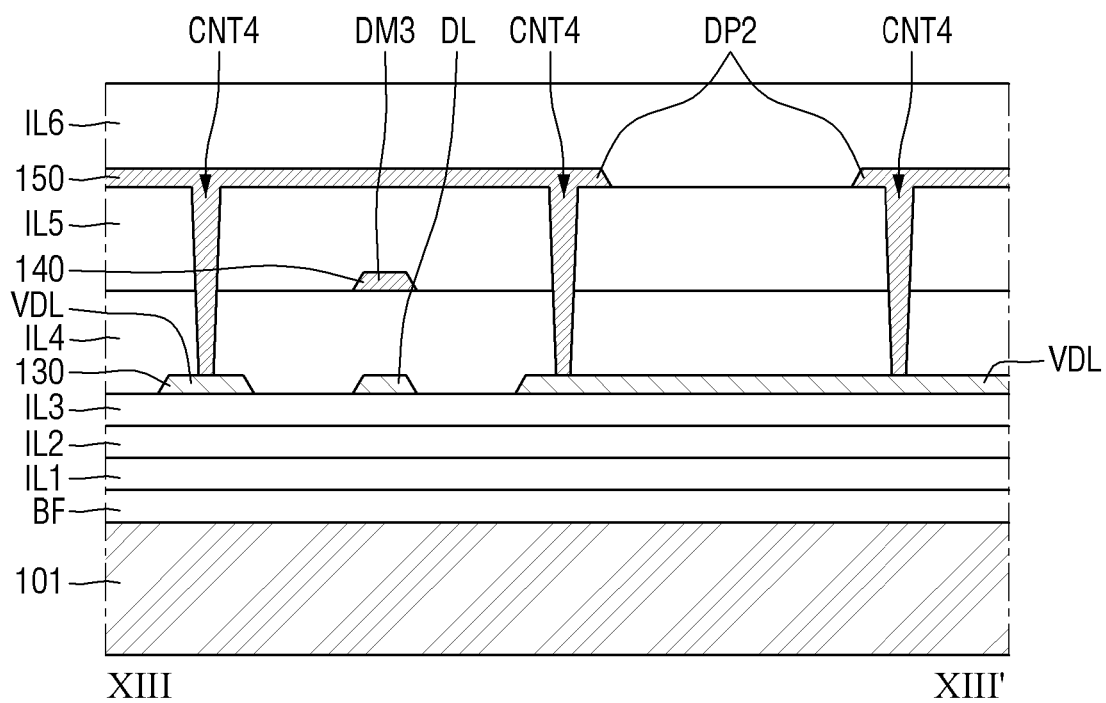
FIG. 13 is a sectional view taken along the line XIII-XIII' of FIG. 12.

FIG. 12 is an enlarged plan view of region B according to another embodiment. FIG. 13 is a sectional view taken along the line XIII-XIII' of FIG. 12.

Referring to FIGS. 12 and 13, this embodiment is different from the embodiments of FIGS. 1 to 11 in that a first power supply voltage line VDL is further included.

The first power supply voltage line VDL may transfer a driving voltage and may be located on one side of the signal line DL. The first power supply voltage line VDL may extend in the first direction DR1 and may be sequentially arranged at specific intervals along the second direction DR2.

The first power supply voltage line VDL may be located on the same layer as the layer on which the signal lines DL are located. In addition, the first power supply voltage line VDL may be located on a different layer from the layer on which the second dummy lines DP2 are located and may be insulated from the second dummy line DP2 by the insulating layer. For example, as shown in FIG. 13, the first power supply voltage line VDL may be formed of the first conductive layer 130, the second dummy line DP2 may be formed of the third conductive layer 150, and the first power supply voltage line VDL and the second dummy line DP2 may be insulated by the fourth insulating layer IL4 and the fifth insulating layer IL5. The second dummy line DP2 may be electrically connected to the first power supply voltage line VDL through a fourth contact hole CNT4 formed through the fourth insulating layer IL4 and the fifth insulating layer IL5 to partially expose the first power supply voltage line VDL. In this case, a resistance of the first power supply voltage line VDL may be minimized or reduced so that a power supply voltage drop (IR drop) may be alleviated. Accordingly, luminance uniformity LRU of the display device 1 may be improved.

Figure 14:
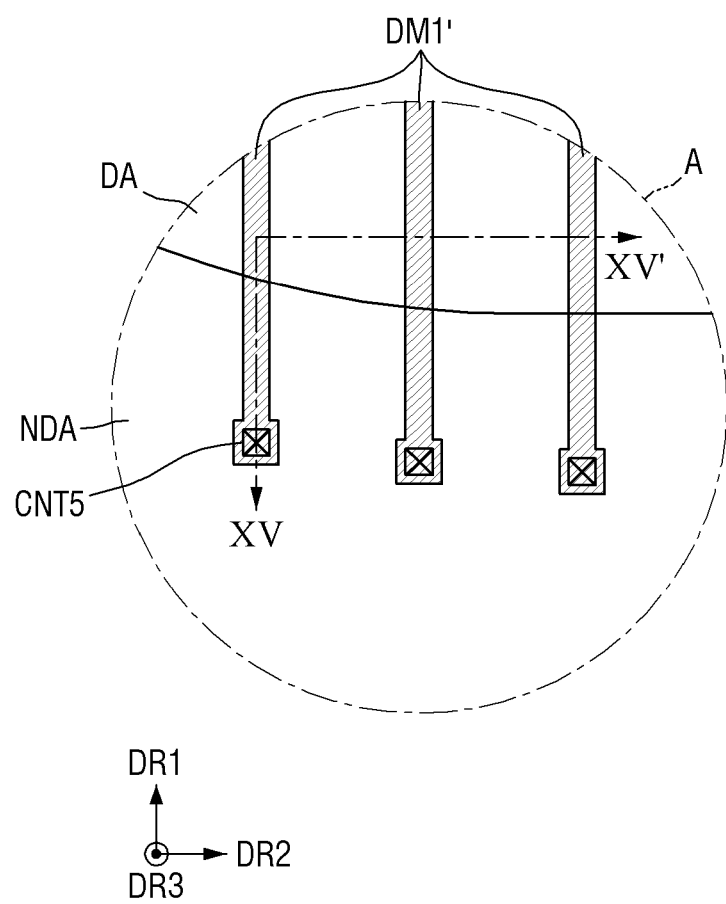
FIG. 14 is an enlarged plan view of the region A according to some example embodiments.
Figure 15:
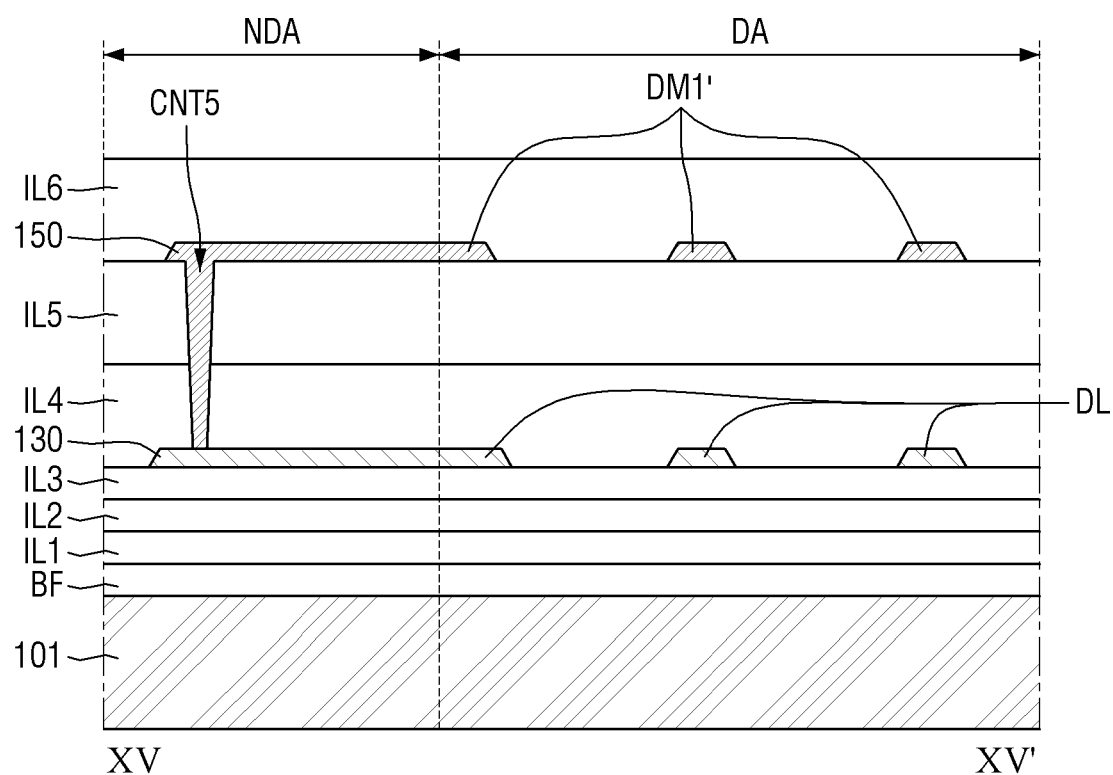
FIG. 15 is a sectional view taken along the line XV-XV' of FIG. 14.
Figure 16:
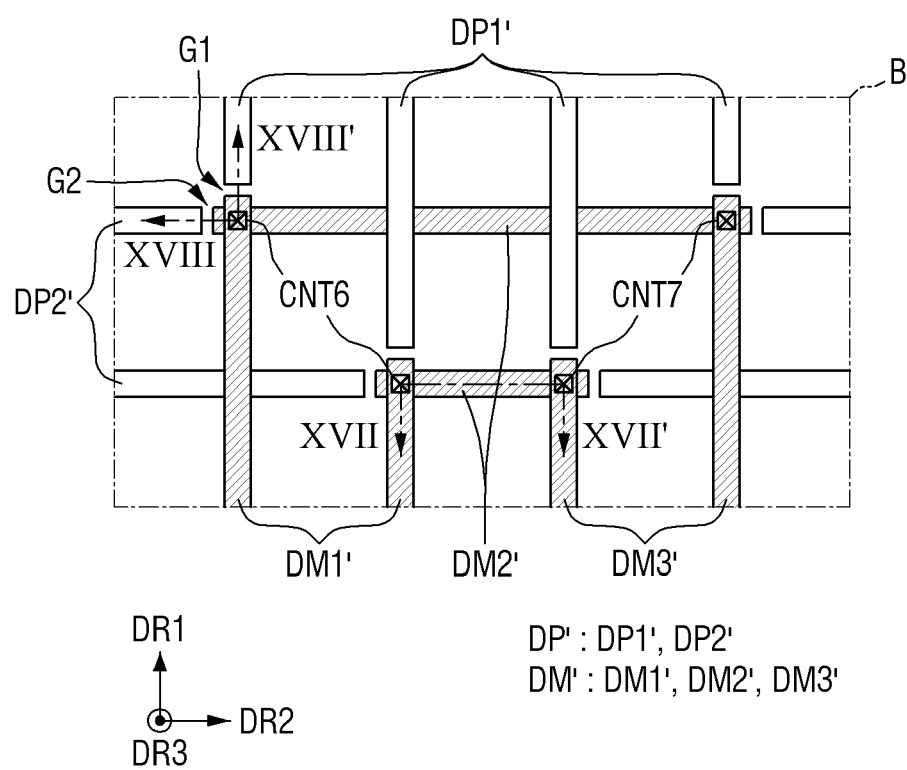
FIG. 16 is an enlarged plan view of the region B according to some example embodiments.
Figure 17:
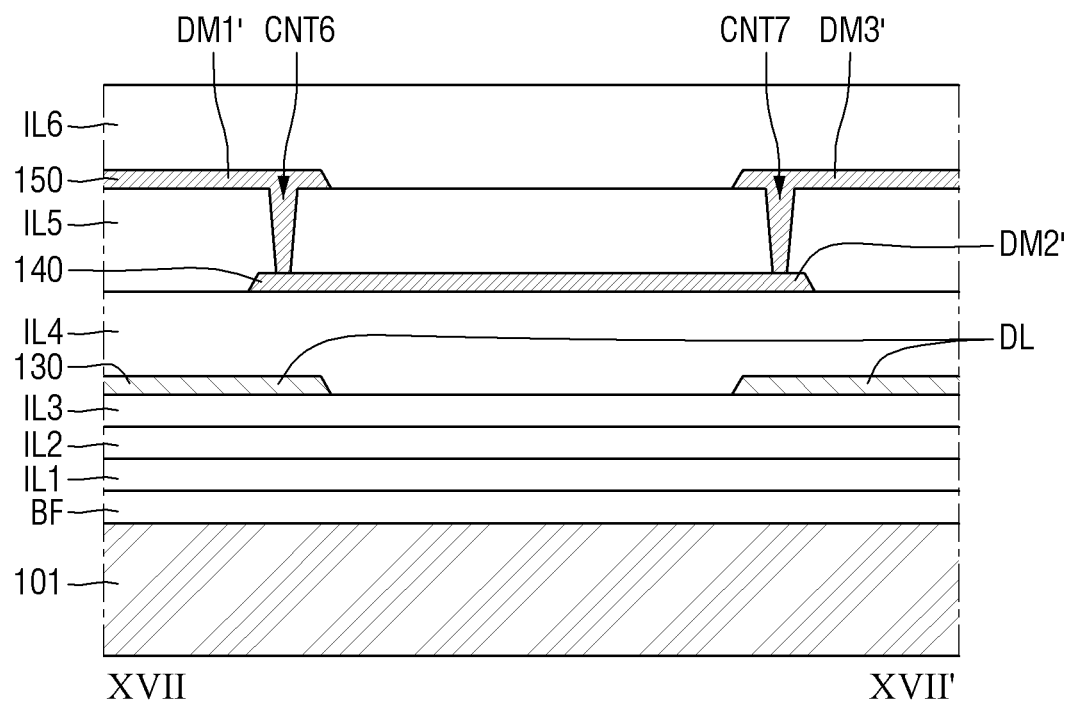
FIG. 17 is a sectional view taken along the line XVII-XVII' of FIG. 16.
Figure 18:
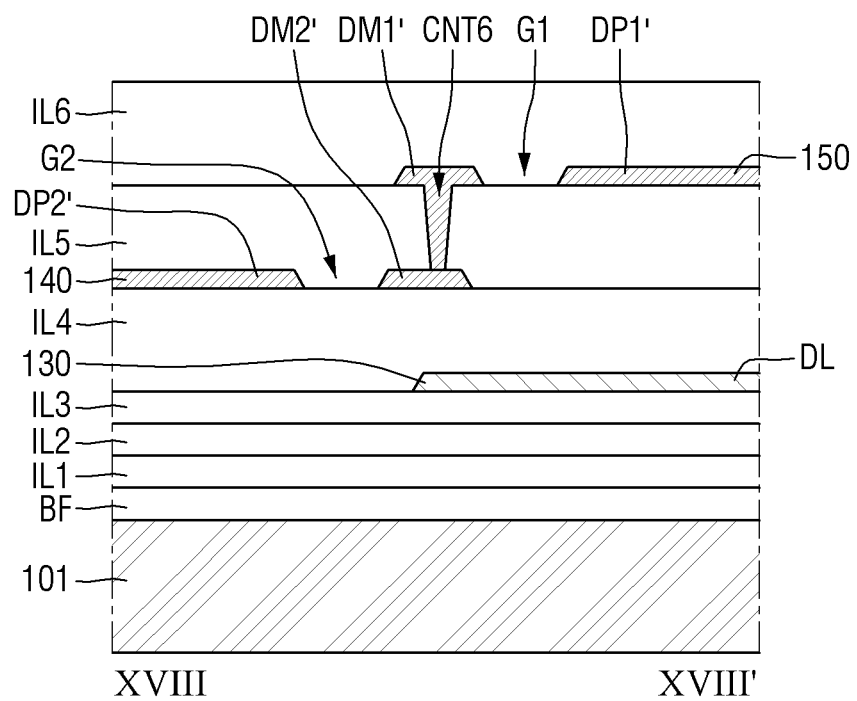
FIG. 18 is a sectional view taken along the line XVIII-XVIII' of FIG. 16.

FIG. 14 is an enlarged plan view of region A according to still another embodiment. FIG. 15 is a sectional view taken along the line XV-XV' of FIG. 14. FIG. 16 is an enlarged plan view of region B according to still another embodiment. FIG. 17 is a sectional view taken along the line XVII-XVII' of FIG. 16. FIG. 18 is a sectional view taken along the line XVIII-XVIII' of FIG. 16.

Referring to FIGS. 14 to 18, this embodiment is different from the embodiments of FIGS. 1 to 11 in view of an arrangement of conductive layers constituting connection lines DM' and dummy lines DP'.

For example, a first connection line DM1' may be located on a different layer from the layer on which the signal line DL is located and may be insulated from the signal line DL by an insulating layer. For example, as shown in FIG. 15, the signal line DL may be formed of the first conductive layer 130, the first connection line DM1' may be formed of the third conductive layer 150, and the signal line DL and the first connection line DM1' may be insulated by the fourth insulating layer IL4 and the fifth insulating layer IL5. One end of the first connection line DM1' may be electrically connected to the signal line DL through a fifth contact hole CNT5 formed through the fourth insulating layer IL4 and the fifth insulating layer IL5 to expose one end of the signal line DL. An interval between the plurality of first connection lines DM1' may be substantially the same as an interval between the signal lines DL.

Meanwhile, FIGS. 14 to 16 illustrate that the first connection line DM1' overlaps the signal line DL in the thickness direction but embodiments according to the present disclosure are not limited thereto. In other words, the first connection line DM1' may be arranged to not overlap the signal line DL when viewed from the top. In this case, the first connection line DM1' may be located in a space where the plurality of signal lines DL are spaced apart from each other.

A second connection line DM2' may be located on a different layer from the layer on which the first connection line DM1' is located and may be insulated from the first connection line DM1' by an insulating layer. For example, as shown in FIG. 17, the first connection line DM1' may be formed of the third conductive layer 150, the second connection line DM2' may be formed of the second conductive layer 140, and the first connection line DM1' may be insulated from the second connection line DM2' by the fifth insulating layer IL5. The other end of the first connection line DM1' may be electrically connected to the second connection line DM2' through a sixth contact hole CNT6 formed through the fifth insulating layer IL5 to expose one end of the second connection line DM2'.

A third connection line DM3' may be located on a different layer from the layer on which the second connection line DM2' is located and may be insulated from the second connection line DM2' by an insulating layer. In addition, the third connection line DM3' may be located on the same layer as the layer on which the first connection lines DM1' are located. For example, as shown in FIG. 17, the second connection line DM2' may be formed of the second conductive layer 140, the third connection line DM3' may be formed of the third conductive layer 150, and the second connection line DM2' may be insulated from the third connection line DM3' by the fifth insulating layer IL5. One end of the third connection line DM3' may be electrically connected to the second connection line DM2' through a seventh contact hole CNT7 formed through the fifth insulating layer IL5 to expose the other end of the second connection line DM2'.

Meanwhile, FIG. 16 illustrates that the third connection line DM3' overlaps the signal line DL in the thickness direction but embodiments according to the present disclosure are not limited thereto. In other words, the third connection line DM3' may be arranged to not overlap the signal line DL when viewed from the top. In this case, the third connection line DM3' may be located in a space where the plurality of signal lines DL are spaced apart from each other.

As described above, the display device 1 may include the first to third connection lines DM1', DM2' and DM3' located via the display area DA and provide an image signal to the signal lines DL through the first to third connection lines DM1', DM2' and DM3'. Accordingly, since the additional dead space required for connecting the signal lines DL to the driving chip 20 may be unnecessary, the dead space can be minimized or reduced as described above.

A first dummy line DP1' may be located on the same layer as the layer on which the first connection lines DM1' and/or the third connection lines DM3' are located. In addition, the first dummy line DP1' may be located on a different layer from the layer on which the second connection lines DM2' are located. For example, as shown in FIG. 18, the first dummy line DP1' may be formed of the third conductive layer 150.

Meanwhile, FIGS. 16 and 18 illustrate that the first connection line DM1' overlaps the signal line DL in the thickness direction but embodiments according to the present disclosure are not limited thereto. In other words, the first dummy line DP1' may be arranged to not overlap the signal line DL when viewed from the top. In this case, the first dummy line DP1' may be located in a space where the plurality of signal lines DL are spaced apart from each other.

A second dummy line DP2' may be located on a different layer from the layer on which the first dummy lines DP1' are located. In addition, the second dummy line DP2' may be located on a different layer from the layer on which the first connection lines DM1' and/or the third connection lines DM3' are located. In addition, the second dummy line DP2' may be located on the same layer as the layer on which the second connection lines DM2' are located. For example, as shown in FIG. 18, the second dummy line DP2' may be formed of the second conductive layer 140.

As described above, when the dummy lines DP1' and DP2' include a plurality of conductive layers, and when the first dummy line DP1' extends in the first direction DR1 and the second dummy line DP2' extends in the second direction, the dummy lines DP1' and DP2' may implement a lattice pattern shape together with the connection lines DM1', DM2' and DM3'. Accordingly, variant patterns are minimized or reduced so that visual recognition of the pattern may be prevented or reduced as described above.

Figure 19:
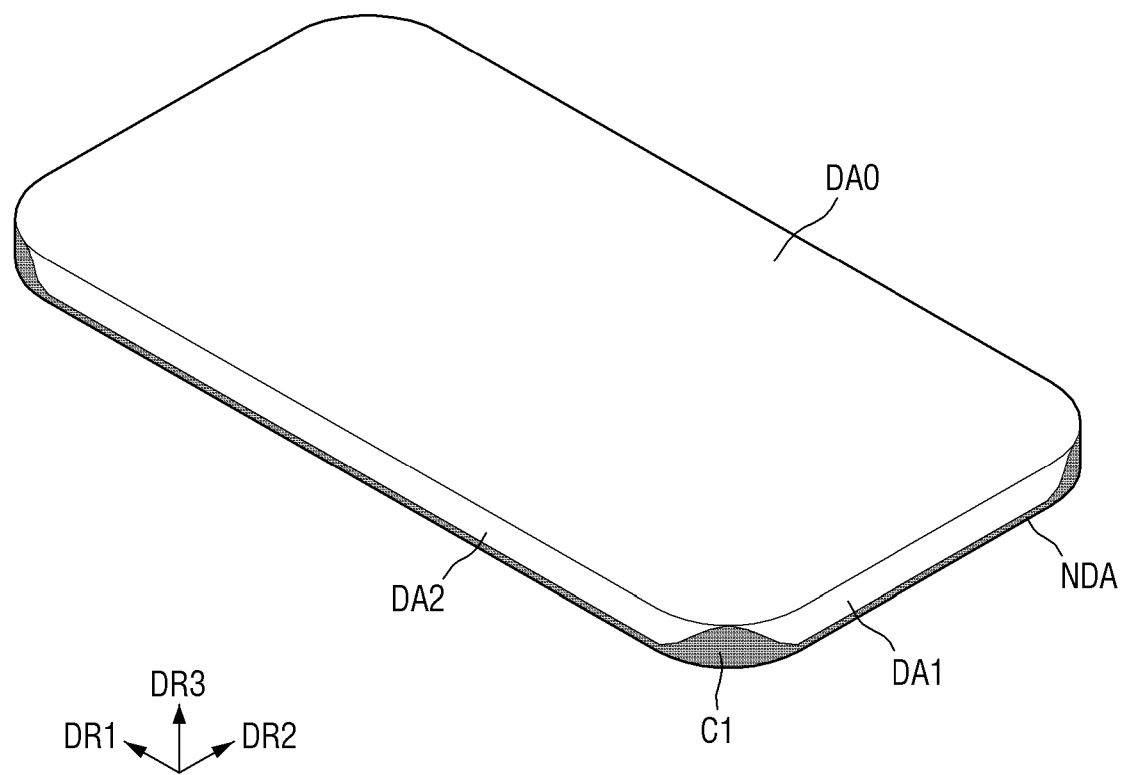
FIG. 19 is a perspective view of a display device according to some example embodiments.
Figure 20:
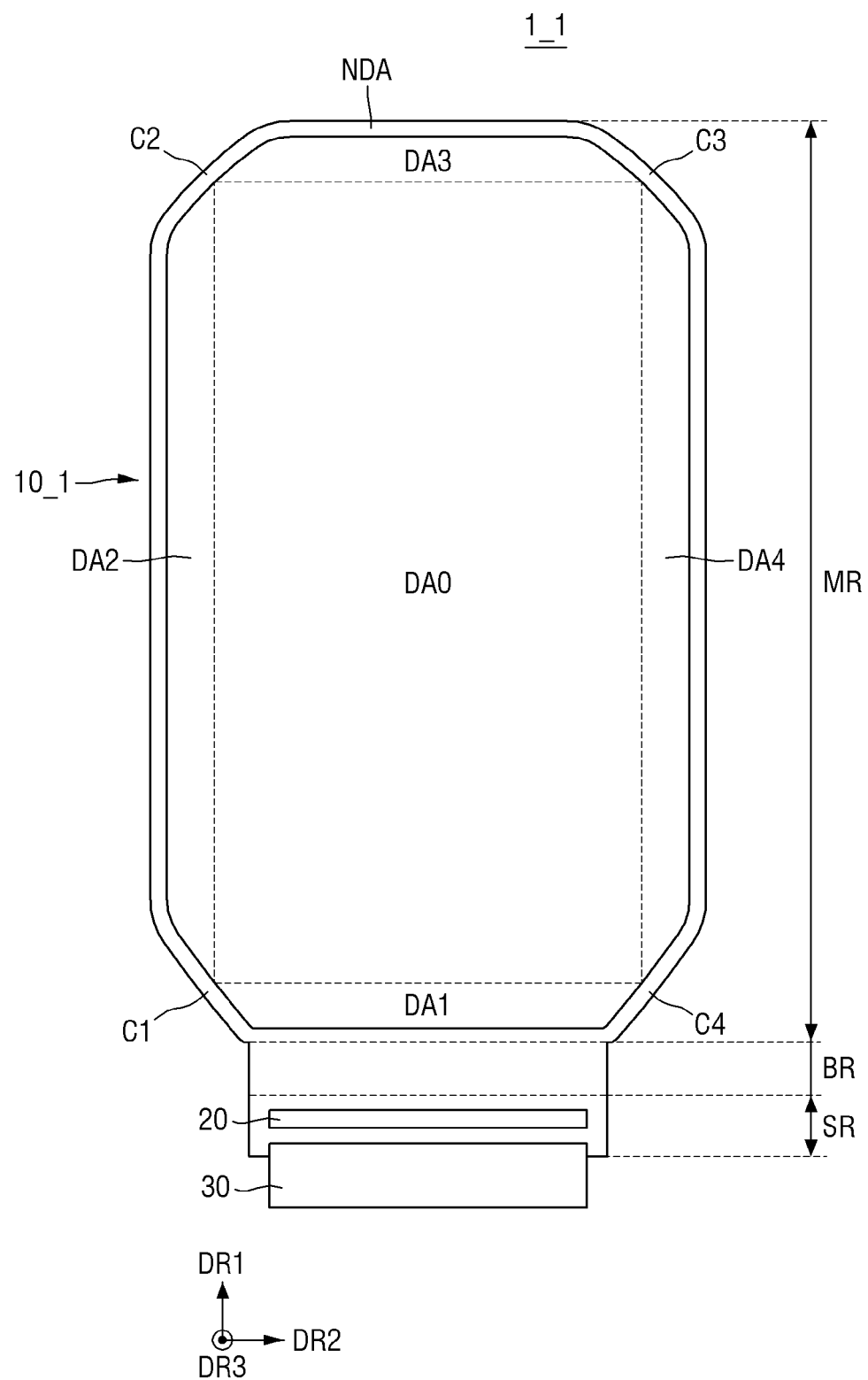
FIG. 20 is a development view of the display device of FIG. 19.
Figure 21:
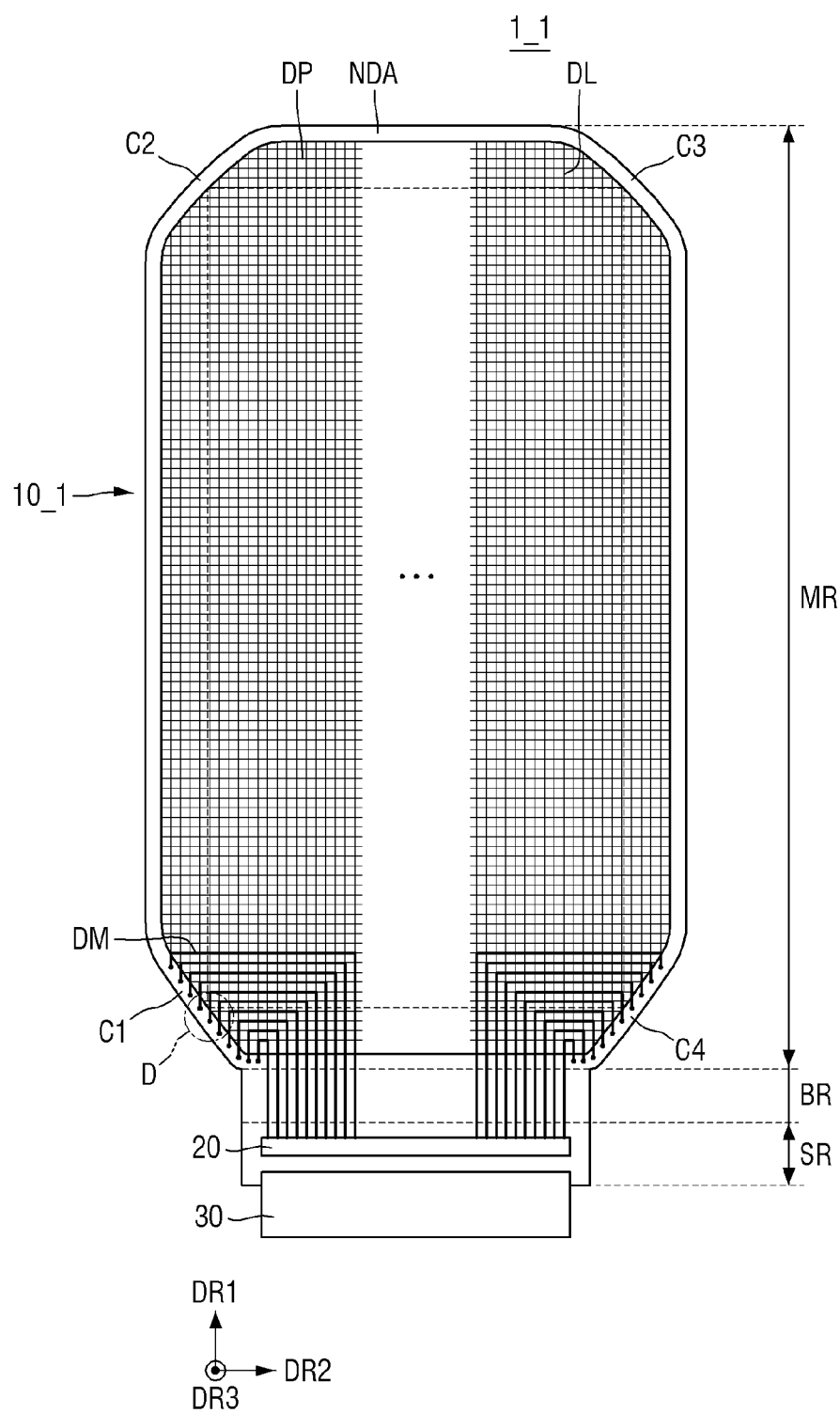
FIG. 21 is a development view showing signal lines and connection lines of the display device of FIG. 19.
Figure 22:
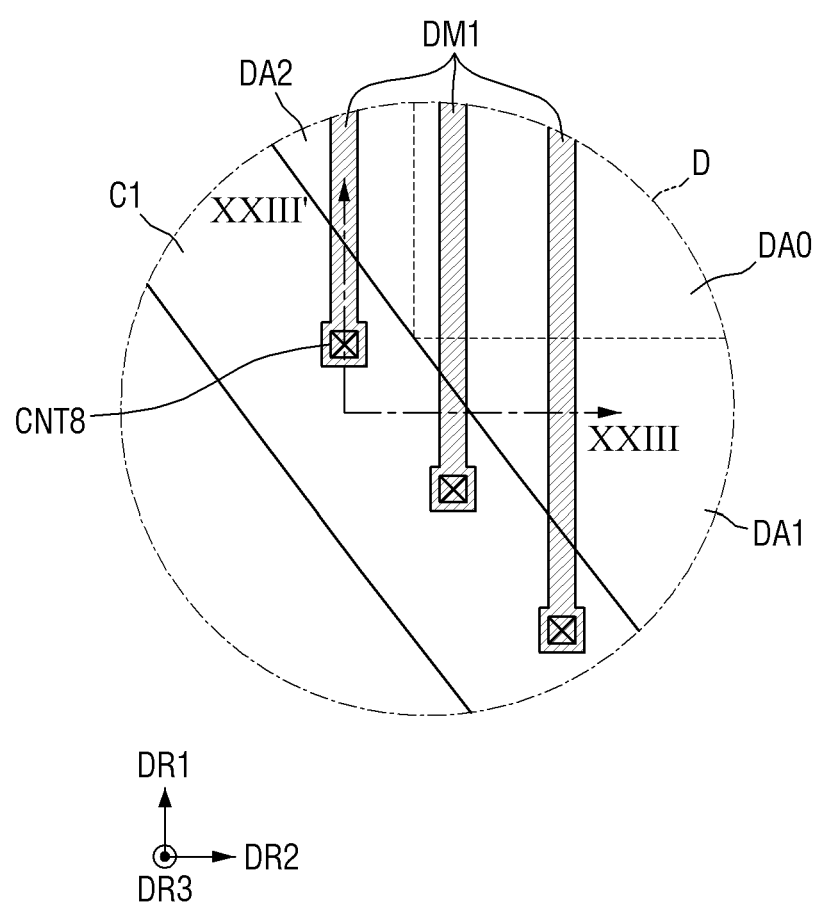
FIG. 22 is an enlarged plan view of the region D of FIG. 21.
Figure 23:
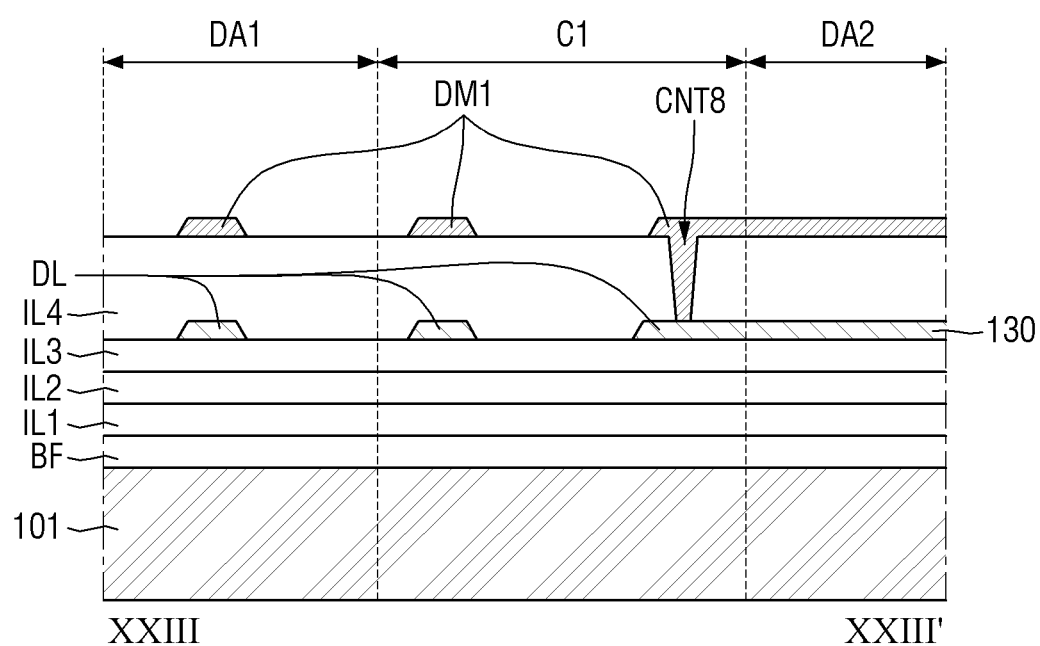
FIG. 23 is a sectional view taken along the line XXIII-XXIII' of FIG. 22.

FIG. 19 is a perspective view of a display device according to yet another embodiment. FIG. 20 is a development view of the display device of FIG. 19. FIG. 21 is a development view showing signal lines, connection lines, and dummy lines of the display device of FIG. 19. FIG. 22 is an enlarged plan view of region D of FIG. 21. FIG. 23 is a sectional view taken along the line XXIII-XXIII' of FIG. 22.

Referring to FIGS. 19 to 23, a display device 1_1 according to the present embodiment is different from the embodiments of FIGS. 1 to 11 in that a main region MR includes a front display area DA0, side display areas DA1, DA2, DA3, and DA4, and corner areas C1, C2, C3, and C4.

The front display area DA0 and the side display areas DA1, DA2, DA3, and DA4 may be display areas DA configured to display an image. The corner areas C1, C2, C3, and C4 are non-display areas NDA that do not display an image and may provide a space through which the signal line DL and the connection line DM pass.

The front display area DA0 may have a rectangular shape including two long sides extending in the first direction DR1 and two short sides extending in the second direction DR2. However, embodiments according to the present disclosure are not limited thereto, and the front display area DA0 may be formed in a polygonal shape having round corners at which the short sides and the long sides meet.

The side display areas DA1, DA2, DA3, and DA4 may include a first side display area DA1, a second side display area DA2, a third side display area DA3, and a fourth side display area DA4.

The first side display area DA1 may be an area extending in the direction opposite to the first direction DR1 at an edge of the front display area DA0, the second side display area DA2 may be an area extending in the direction opposite to the second direction DR2 at an edge of the front display area DA0, the third side display area DA3 may be an area extending in the first direction DR1 at an edge of the front display area DA0, and the fourth side display area DA4 may be an area extending in the second direction DR2 at an edge of the front display area DA0.

The first to fourth side display areas DA1, DA2, DA3, and DA4 may have a function or configuration substantially the same as each other except for locations. Hereinafter, common features of the first to fourth side display areas DA1, DA2, DA3, and DA4 will be described based on the first side display area DA1, and duplicate descriptions will be omitted.

The first side display area DA1 may extend outward from the edge of the front display area DA0 and be bent at an angle (e.g., a set or predetermined angle). For example, the first side display area DA1 may be bent at an angle of 90° to 150° with respect to the front display area DA0.

The first side display area DA1 may be connected to the bending region BR. As shown in FIG. 19, when the first side display area DA1 is curved or bent perpendicularly with respect to the front display area DA0, the bending region BR is curved or bent once more perpendicularly with respect to the first side display area DA1 (in other words, curved or bent at an angle of 180° with respect to the front display area DA0), and thus the sub region SR located at one side of the bending region BR may be located below the front display area DA0 in the thickness direction of the front display area DA0. The sub region SR may overlap the front display area DA0 and may be located in parallel to the front display area DA0.

Corner areas C1, C2, C3, and C4 may be located between the side display areas DA1, DA2, DA3, and DA4. The corner areas C1, C2, C3, and C4 may include first to fourth corner areas C1, C2, C3, and C4 located between the first to fourth side display areas DA1, DA2, DA3, and DA4. The first to fourth corner areas C1, C2, C3, and C4 may be located adjacent to four corners at which the long sides and the short sides meet each other. The first to fourth corner areas C1, C2, C3, and C4 may have a function or configuration substantially the same as each other except for locations. Hereinafter, common features of the first to fourth corner areas C1, C2, C3, and C4 will be described based on the first corner area C1, and duplicate descriptions will be omitted.

The first corner area C1 may be located between the first side display area DA1 and the second side display area DA2. One end of the first corner area C1 may come into contact with the first side display area DA1, and the other end of the first corner area C1 may come into contact with the second side display area DA2.

The first corner area C1 may extend from the front display area DA0 and may be rounded to have a curvature (e.g., a set or predetermined curvature). The curvature of the first corner area C1 with respect to the front display area DA0 may be greater than curvatures of the first side display area DA1 and the second side display area DA2 with respect to the front display area DA0.

The first corner area C1 may provide a space in which the signal lines DL may be connected to the connection lines DM. The signal lines DL and the connection lines DM will be described in detail with reference to FIGS. 21 to 23.

Referring to FIGS. 21 to 23, the display device 1_1 may include a plurality of signal lines DL, a plurality of connection lines DM, and a plurality of dummy lines DP. Meanwhile, the signal lines DL, the connection lines DM, and the dummy lines DP are configured to extend in the first direction DR1 or the second direction DR2, and may be symmetrical with respect to a reference axis (not shown) formed through a center of an area of the display device 1_1. Hereinafter, the description will be focused on the signal lines DL, the connection lines DM, and the dummy lines DP that are located on a left side of the display device 1_1.

The plurality of signal lines DL may extend from the non-display area NDA and located in the side display areas DA1, DA2, DA3, and DA4 and the front display area DA0. The signal lines DL may extend in the first direction DR1 and may be sequentially arranged at specific intervals along the second direction DR2. One end of the signal line DL may be electrically connected to the connection line DM, and the one end of the signal line DL connected to the connection line DM may be located in the non-display area NDA below the main region MR, for example, the first corner area C1. The one end of the signal line DL may be electrically connected to the connection line DM through an eighth contact hole CNT8 located in the first corner area C1. Detailed description thereof will be provided later.

The plurality of connection lines DM may extend from the non-display area NDA and extend to the non-display area NDA, for example, the first corner area C1 via the first display area DA1, the second side display area DA2, or the front display area DA0. Each of the connection lines DM may include first connection lines DM1 respectively connected to the signal lines DL, second connection lines DM2 respectively connected to the first connection lines DM1, and third connection lines DM3 respectively connected to the second connection lines DM2.

The plurality of first connection lines DM1 may extend from the non-display area NDA, for example, the first corner area C1, and be located in the first side display area DA1, the second side display area DA2, or the front display area DA0. The first connection lines DM1 may extend in the first direction DR1, and may be sequentially arranged at specific intervals along the second direction DR2. One end of the first connection line DM1 may be located in the first corner area C1, and the other end of the first connection line DM1 may be located in the second side display area DA2 or the front display area DA0. The one end of the first connection line DM1 may extend to one end of the signal line DL located in the first corner area C1. The one end of the first connection line DM1 may be electrically connected to the signal line DL in the first corner area C1. The first connection line DM1 may be located on a different layer from a layer on which the signal line DL is located and may be insulated from the signal line DL by an insulating layer. For example, as shown in FIG. 23, the signal line DL may be formed of the first conductive layer 130, the first connection line DM1 may be formed of the second conductive layer 140, and the signal line DL may be insulated from the first connection line DM1 by the fourth insulating layer IL4. The one end of the first connection line DM1 may pass through the fourth insulating layer IL4 and be electrically connected to the signal line DL through the eighth contact hole CNT8 exposing one end of the signal line DL.

Meanwhile, FIGS. 22 and 23 illustrate that the eighth contact hole CNT8 is located in the first corner area C1, but embodiments according to the present disclosure are not limited thereto. In other words, as shown in FIG. 21, the eighth contact hole CNT8 may be located in the non-display area NDA located between the first side display area DA1 and the bending region BR.

In addition, since the second connection line DM2, the third connection line DM3, the first dummy line DP1, and the second dummy line DP2 have been described with reference to FIGS. 1 to 11, duplicate descriptions will be omitted.

As described above, the display device 1_1 may include the first to third connection lines DM1, DM2 and DM3 located via the front display area DA0 and the side display areas DA1, DA2, DA3, and DA4 and provide an image signal to the signal lines DL through the first to third connection lines DM1, DM2 and DM3. Accordingly, an additional dead space required for connecting the signal lines DL to the driving chip 20 may be unnecessary. In other words, the dead space may be minimized or reduced as described above.

According to a display device of an embodiment, a connection line is located in a display area so that a dead space of the display device can be reduced.

In addition, the connection line and the dummy line are formed of a plurality of conductive layers to minimize or reduce variant patterns so that visual recognition of the pattern can be prevented or reduced.

In addition, lines located below a sub-pixel are evenly designed so that a step difference in a light emitting area can be minimized or reduced. In other words, degradation of display quality of the display device may be prevented or reduced.

The effects according to embodiments of the present disclosure are not limited by the contents of the description of the example embodiments above, and various effects are included within the specification herein.

In concluding the detailed description, those skilled in the art will appreciate that many variations and modifications can be made to the example embodiments without substantially departing from the principles of the present invention. Therefore, the disclosed example embodiments of the invention are used in a generic and descriptive sense only and not for purposes of limitation.

What is claimed is:

1. A display device, comprising:
   a substrate including a display area and a non-display area;
   a buffer layer on the substrate;
   a semiconductor layer on the buffer layer;
   a first insulating layer on the semiconductor layer;
   a first gate layer on the first insulating layer;
   a second insulating layer on the first gate layer;
   a second gate layer on the second insulating layer;
   a third insulating layer on the second gate layer;
   a source electrode on the third insulating layer;
   a fourth insulating layer on the source electrode;
   a first signal line in the display area of the substrate and extended in a first direction, the first signal line is disposed on the fourth insulating layer;
   a first dummy pattern from among a plurality of first dummy patterns in the display area and extended in the first direction, a first dummy pattern is disposed on the fourth insulating layer;
   a fifth insulating layer on the first signal line and the first dummy pattern;
   a second signal line on the fifth insulating layer and extended in a second direction;
   a second dummy pattern on the fifth insulating layer and extended in the second direction;
   a sixth insulation layer on the second signal line and the second dummy pattern;
   an anode on the sixth insulating layer;
   an organic light emitting layer on the anode;
   a cathode on the organic light emitting layer; and
   a third signal line in the non-display area,
   wherein the first signal line and the first dummy pattern are in a same layer,
   wherein the first dummy pattern is adjacent to the first signal line,
   wherein a first gap is between one end or an other end of the first signal line and one end or an other end of the first dummy pattern,
   wherein the second signal line and the second dummy pattern are in a same layer,
   wherein the second dummy pattern is adjacent to the second signal line,
   wherein a second gap is between one end or an other end of the second signal line and one end or an other end of the second dummy pattern, and
   wherein the first dummy pattern is electrically connected to the third signal line in the non-display area.

2. The display device of claim 1, wherein the third signal line is a power supply voltage line.

3. An electronic device comprising the display device of claim 1, wherein the electronic device is at least one of a mobile phone, smart phone, tablet personal computer (PC), smart watch, watch phone, mobile communication terminal, electronic notebook, electronic book, portable multimedia player (PMP), navigation, ultra mobile PC (UMPC), television, notebook computer, monitor, signboard, or internet of things device.

4. A display device, comprising:
   a substrate including a display area and a non-display area;
   a buffer layer on the substrate;

a semiconductor layer on the buffer layer;
a first insulating layer on the semiconductor layer;
a first gate layer on the first insulating layer;
a second insulating layer on the first gate layer;
a second gate layer on the second insulating layer;
a third insulating layer on the second gate layer;
a source electrode on the third insulating layer;
a fourth insulating layer on the source electrode;
a first signal line in the display area of the substrate and extended in a first direction, the first signal line is disposed on the fourth insulating layer;
a first dummy pattern from among a plurality of first dummy patterns in the display area and extended in the first direction, a first dummy pattern is disposed on the fourth insulating layer;
a fifth insulating layer on the first signal line and the first dummy pattern;
a second signal line on the fifth insulating layer and extended in a second direction; and
a second dummy pattern on the fifth insulating layer and extended in the second direction;
a sixth insulation layer on the second signal line and the second dummy pattern;
an anode on the sixth insulating layer;
an organic light emitting layer on the anode;
a cathode on the organic light emitting layer; and
a third signal line in the non-display area,
wherein the first signal line and the first dummy pattern are in a same layer,
wherein the first dummy pattern is adjacent to the first signal line,
wherein a first gap is between one end or an other end of the first signal line and one end or an other end of the first dummy pattern,
wherein the second signal line and the second dummy pattern are in a same layer,
wherein the second dummy pattern is adjacent to the second signal line,
wherein a second gap is between one end or an other end of the second signal line and one end or an other end of the second dummy pattern, and
wherein the second dummy pattern is electrically connected to the third signal line in the non-display area.

5. The display device of claim 4, wherein the third signal line is a power supply voltage line.

6. An electronic device comprising the display device of claim 4, wherein the electronic device is at least one of a mobile phone, smart phone, tablet personal computer (PC), smart watch, watch phone, mobile communication terminal, electronic notebook, electronic book, portable multimedia player (PMP), navigation, ultra mobile PC (UMPC), television, notebook computer, monitor, signboard, or internet of things device.

7. A display device, comprising:
a substrate including a display area and a non-display area;
a buffer layer on the substrate;
a semiconductor layer on the buffer layer;
a first insulating layer on the semiconductor layer;
a first gate layer on the first insulating layer;
a second insulating layer on the first gate layer;
a second gate layer on the second insulating layer;
a third insulating layer on the second gate layer;
a source electrode on the third insulating layer;
a fourth insulating layer on the source electrode;
a first signal line in the display area of the substrate and extended in a first direction, the first signal line is disposed on the fourth insulating layer;
a first dummy pattern in the display area and extended in the first direction, a first dummy pattern is disposed on the fourth insulating layer;
a fifth insulating layer on the first signal line and the first dummy pattern;
a second dummy pattern in the display area and extended in a second direction, the second dummy pattern is disposed on the fifth insulating layer;
a second signal line in the display area of the substrate and extended in the second direction, the second signal line is disposed on the fifth insulating layer;
a sixth insulation layer on the second signal line and the second dummy pattern;
an anode on the sixth insulating layer;
an organic light emitting layer on the anode;
a cathode on the organic light emitting layer; and
a power supply voltage line in the non-display area,
wherein the first signal line is electrically connected to the second signal line, and
wherein the first dummy pattern or the second dummy pattern is electrically connected to the power supply voltage line.

8. The display device of claim 7, further comprising:
a first gap between one end or an other end of the first signal line and one end or an other end of the first dummy pattern,
wherein the first signal line and the first dummy pattern are in a same layer.

9. The display device of claim 8, further comprising:
a second gap between one end or an other end of the second signal line and one end or an other end of the second dummy pattern,
wherein the second signal line and the second dummy pattern are in a same layer.

10. The display device of claim 7, further comprising:
a third signal line in the display area of the substrate and extended in a first direction,
wherein the third signal line and the first signal line is electrically connected to the second signal line.

11. An electronic device comprising the display device of claim 7, wherein the electronic device is at least one of a mobile phone, smart phone, tablet personal computer (PC), smart watch, watch phone, mobile communication terminal, electronic notebook, electronic book, portable multimedia player (PMP), navigation, or ultra mobile PC (UMPC), television, notebook computer, monitor, signboard, or internet of things device.

* * * * *